United States Patent
Park et al.

(10) Patent No.: US 12,382,801 B2
(45) Date of Patent: Aug. 5, 2025

(54) DISPLAY APPARATUS

(71) Applicant: Samsung Display Co., Ltd., Yongin-si (KR)

(72) Inventors: Beomyeol Park, Yongin-si (KR); Jiryun Park, Yongin-si (KR); Inhyuck Yeo, Yongin-si (KR); Eunae Jung, Yongin-si (KR); Seunghwan Cho, Yongin-si (KR); Wonsuk Choi, Yongin-si (KR); Yoonsun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 474 days.

(21) Appl. No.: 18/046,420

(22) Filed: Oct. 13, 2022

(65) Prior Publication Data
US 2023/0225161 A1    Jul. 13, 2023

(30) Foreign Application Priority Data
Jan. 11, 2022    (KR) .................. 10-2022-0004300

(51) Int. Cl.
*H10K 59/131*    (2023.01)
(52) U.S. Cl.
CPC .................. *H10K 59/131* (2023.02)
(58) Field of Classification Search
None
See application file for complete search history.

(56) References Cited

U.S. PATENT DOCUMENTS

| | | | |
|---|---|---|---|
| 10,978,447 B2* | 4/2021 | Kim | .............. H10K 59/131 |
| 2005/0077814 A1 | 4/2005 | Koo et al. | |
| 2021/0057503 A1 | 2/2021 | Heo et al. | |
| 2021/0225834 A1 | 7/2021 | Kim et al. | |

(Continued)

FOREIGN PATENT DOCUMENTS

| | | |
|---|---|---|
| KR | 10-2007-0043551 A | 4/2007 |
| KR | 10-2019-0093228 A | 8/2019 |

(Continued)

OTHER PUBLICATIONS

EPO Extended Search Report dated May 17, 2023, issued in corresponding European Patent Application No. 23150838.3 (6 pages).

*Primary Examiner* — Jack S Chen
(74) *Attorney, Agent, or Firm* — Womble Bond Dickinson (US) LLP

(57) ABSTRACT

A display apparatus includes: a substrate including a display area, and a peripheral area outside the display area; a common voltage supply line including a first common voltage input unit, a second common voltage input unit, and a body portion; a common voltage division line including a first division line branching from the first common voltage input unit, a second division line branching from the second common voltage input unit, and a third division line connecting the first division line and the second division line to each other; a first common voltage line connected to the third division line, and extending in a first direction to cross the display area; and a second common voltage line connected to the first division line or the second division line, and extending in a second direction crossing the first direction to cross the display area.

20 Claims, 12 Drawing Sheets

(56) References Cited

U.S. PATENT DOCUMENTS

2022/0328611 A1   10/2022  Lu et al.
2023/0225161 A1*  7/2023   Park .................. H10K 59/8052
                                                    257/91

FOREIGN PATENT DOCUMENTS

KR   10-2020-0076095 A   6/2020
KR   10-2021-0022802 A   3/2021
WO      2021/190334 A1   9/2021

* cited by examiner

DISPLAY APPARATUS

CROSS-REFERENCE TO RELATED APPLICATION

This application claims priority to and the benefit of Korean Patent Application No. 10-2022-0004300, filed on Jan. 11, 2022, in the Korean Intellectual Property Office, the entire disclosure of which is incorporated by reference herein.

BACKGROUND

1. Field

Aspects of one or more embodiments relate to display apparatuses.

2. Description of the Related Art

In general, a display apparatus includes thin-film transistors that are arranged in a display area, and configured to control a luminance of a light-emitting diode or the like. The thin-film transistors are configured to control a corresponding light-emitting diode to emit light of a desired color by using a received data signal, a driving voltage, and a common voltage.

To provide the data signal, the driving voltage, and the common voltage, a data driving circuit, a driving voltage supply line, a common voltage supply line, and the like are located in a peripheral area outside the display area.

The above information disclosed in this Background section is for enhancement of understanding of the background of the present disclosure, and therefore, it may contain information that does not constitute prior art.

SUMMARY

As a proportion occupied by a display area in which an image may be provided in a display apparatus increases, a peripheral area that is a dead space in which no light-emitting diodes are arranged decreases, and thus, the quality of light emitted by the light-emitting diodes may degrade.

One or more embodiments of the present disclosure are directed to a display apparatus in which a high-quality image may be displayed, while reducing an area of a dead space.

However, the aspects and features of the present disclosure are not limited to those described above, and additional aspects and features will be set forth, in part, in the description that follows, and in part, will be apparent from the description, or may be learned by practicing one or more of the presented embodiments of the present disclosure.

According to one or more embodiments of the present disclosure, a display apparatus includes: a substrate including a display area, and a peripheral area outside the display area; a common voltage supply line including a first common voltage input unit and a second common voltage input unit at the peripheral area and adjacent to a first edge of the display area, and a body portion connecting the first common voltage input unit and the second common voltage input unit to each other; a common voltage division line including a first division line branching from the first common voltage input unit, a second division line branching from the second common voltage input unit, and a third division line connecting the first division line and the second division line to each other; a first common voltage line connected to the third division line, and extending in a first direction to cross the display area; and a second common voltage line connected to the first division line or the second division line, and extending in a second direction crossing the first direction to cross the display area.

In an embodiment, the display apparatus may further include a first organic layer extending to the peripheral area from the display area, and covering the common voltage division line. The first organic layer may include a first opening between the body portion and the common voltage division line.

In an embodiment, the body portion may be spaced from the first opening.

In an embodiment, the display apparatus may further include: a light-emitting diode at the display area, and including a pixel electrode, an emission layer, and an opposite electrode; and a metal pattern at the peripheral area, and electrically connecting the body portion and the opposite electrode to each other.

In an embodiment, the metal pattern may be located on the first organic layer, the first organic layer may include a second opening exposing an upper surface of the common voltage division line, and the metal pattern and the common voltage division line may be in direct contact with each other in the second opening.

In an embodiment, a boundary of the opposite electrode may overlap with a boundary of the first organic layer, or may be located adjacent to the boundary of the first organic layer.

In an embodiment, the display apparatus may further include a second organic layer between the metal pattern and the opposite electrode, the second organic layer may include a second opening overlapping with the first opening of the first organic layer, and the opposite electrode may be in contact with the metal pattern in the second opening.

In an embodiment, the pixel electrode and the metal pattern may be located at a same layer as each other.

In an embodiment, the metal pattern may include a plurality of through-holes.

In an embodiment, the common voltage division line and the first common voltage line may be located at a same layer as each other.

In an embodiment, the body portion may include: a first metal line at the peripheral area; a second metal line on the first metal line; and a third metal line on the second metal line.

In an embodiment, the common voltage division line may be located at a same layer as that of the third metal line.

In an embodiment, the second common voltage line may include: a first horizontal connection portion protruding in the second direction from the first division line; a second horizontal connection portion protruding in an opposite direction to the second direction from the second division line; and a horizontal voltage line between the first horizontal connection portion and the second horizontal connection portion.

In an embodiment, the first horizontal connection portion and the second horizontal connection portion may be located at a same layer as that of the common voltage division line, and the horizontal voltage line may be located at a different layer from that of the common voltage division line.

In an embodiment, the display apparatus may further include a first driving circuit located between the body portion and the first division line.

In an embodiment, the display apparatus may further include a second driving circuit located between the body portion and the second division line.

In an embodiment, the common voltage supply line may further include a third common voltage input unit between the first common voltage input unit and the second common voltage input unit, and a portion of the first common voltage line may extend to the third division line from the third common voltage input unit.

In an embodiment, the display apparatus may further include: a first data line located at one side with respect to a virtual line passing through the third common voltage input unit; a first data input line at the peripheral area; and a first connection line at the display area and connecting the first data input line and the first data line to each other.

In an embodiment, the first connection line may include: a vertical connection line extending in the first direction; and a horizontal connection line crossing the vertical connection line. The first common voltage line and the vertical connection line may be located at a same layer as each other.

In an embodiment, the second common voltage line may include a horizontal voltage line extending in the second direction at the display area, and the horizontal connection line and the horizontal voltage line may be located at a same layer as each other.

The above and/or other aspects and features of the present disclosure will become apparent and more readily appreciated from the following detailed description of the embodiments of the present disclosure, the accompanying drawings, and the claims and their equivalents.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
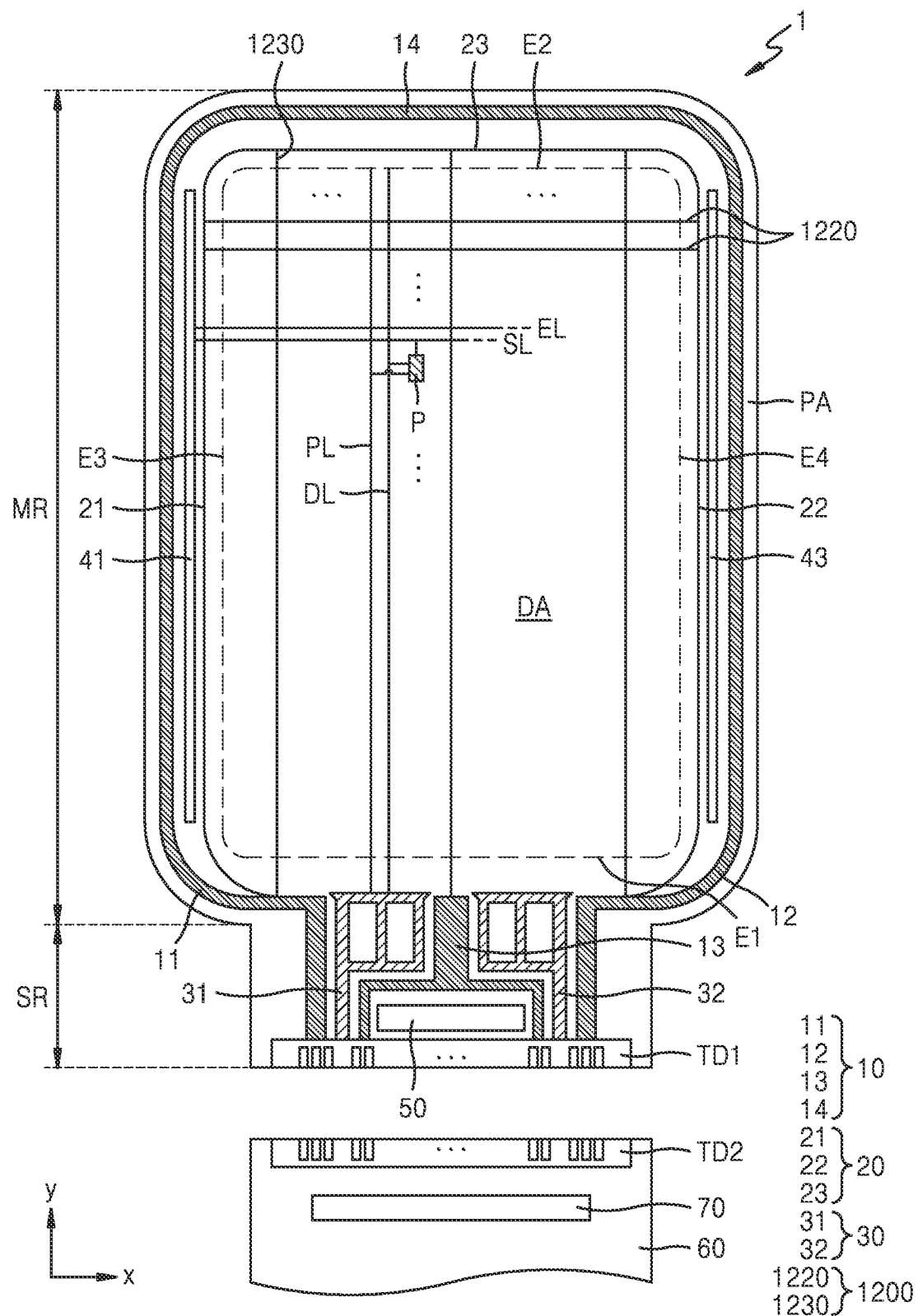
FIG. 1 is a plan view schematically illustrating a portion of a display apparatus according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on" (or "formed on"), "connected to," or "coupled to" another element or layer, it can be directly on (or directly formed on), connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
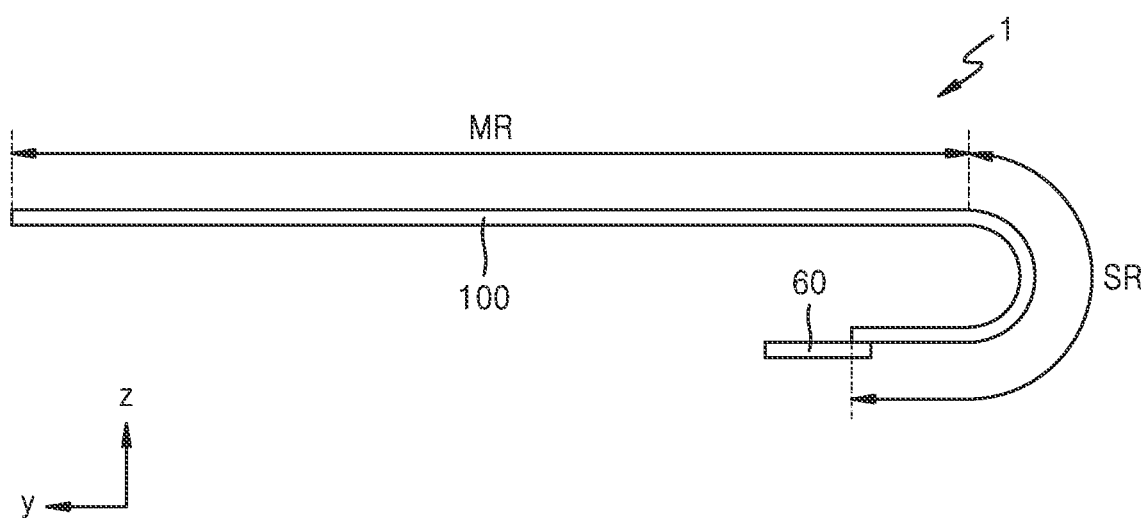
FIG. 2 is a side view schematically illustrating the display apparatus shown in FIG. 1.

FIG. 1 is a plan view schematically illustrating a portion of a display apparatus according to an embodiment, and FIG. 2 is a side view schematically illustrating the display apparatus shown in FIG. 1.

Referring to FIGS. 1 and 2, the display apparatus may include a display panel 1. The display apparatus may be implemented as any suitable display apparatus that includes the display panel 1, which will be described in more detail below. For example, the display apparatus may include (e.g., may be included in or implemented as) various suitable products, such as smartphones, tablet personal computers (PCs), laptop PCs, televisions, advertisement boards, and/or the like.

The display panel 1 may include a display area DA, and a peripheral area PA outside the display area DA. The display area DA is an area in which an image is displayed, and a plurality of pixels P may be arranged at (e.g., in or on) the display area DA. When viewed from a direction perpendicular to or approximately perpendicular to the display panel 1 (e.g., in a plan view), the display area DA may have various suitable shapes, such as a circle, an ellipse, a polygon, or another suitable figure or shape. In FIG. 1, the display area DA has a quadrangular shape or an approximately quadrangular shape having straight or substantially straight edges (e.g., sides), but in another embodiment, the display area DA may have a quadrangular shape or an approximately quadrangular shape with rounded edges (e.g., rounded sides).

The peripheral area PA may be arranged outside the display area DA. The peripheral area PA may entirely surround (e.g., around a periphery of) the display area DA. A portion (hereinafter, referred to as "a protruding peripheral area") of the peripheral area PA may extend in a direction (e.g., a (−) y direction) away from the display area DA. In other words, the display panel 1 may include a main area MR and a sub-area SR. The main area MR includes the display area DA and a portion of the peripheral area PA surrounding (e.g., around a periphery of) the display area DA, and the sub-area SR extends in one direction from the main area MR. The sub-area SR may correspond to the protruding peripheral area. A width (e.g., in an x direction) of the sub-area SR may be less than a width (e.g., in the x direction) of the main area MR, and a portion of the sub-area SR may be bent, for example, as shown in FIG. 2. In a case in which the display panel 1 is bent, as shown in FIG. 2, the peripheral area PA that is a non-display area may not be visible when the display apparatus is viewed, or even when the peripheral area PA is visible, a visible area of the peripheral area PA may be minimized or reduced.

A shape of the display panel 1 may be the same or substantially the same as that of a substrate 100. For example, it may be understood that the substrate 100 includes the display area DA and the peripheral area PA. In some embodiments, it may be understood that the substrate 100 includes the main area MR and the sub-area SR. Hereinafter, for convenience, the substrate 100 will be described in more detail as including the display area DA and the peripheral area PA.

The pixel P is arranged at (e.g., in or on) the display area DA, and may emit at least one of a red light, a green light, or a blue light. For example, the pixel P may emit light of a desired color by using a light-emitting diode. The light-emitting diode may be an organic light-emitting diode, an inorganic light-emitting diode, or a quantum dot light-emitting diode. Hereinafter, for convenience, the light-emitting diode is described in more detail as an organic light-emitting diode.

The light-emitting diode may be connected to a plurality of transistors that are connected to a signal line or a voltage line configured to control turning on/off of the light-emitting diode and the brightness of the light-emitting diode. For example, FIG. 1 shows a scan line SL, an emission control line EL, and a data line DL as signal lines that are connected to the transistors, and further shows a driving voltage line PL and a common voltage line 1200 as voltage lines. A common voltage supply line 10, a common voltage division line 20, a driving voltage supply line 30, a first driving circuit 41, a second driving circuit 43, and a data driving circuit 50 may be arranged at (e.g., in or on) the peripheral area PA.

The common voltage supply line 10 may be arranged at (e.g., in or on) the peripheral area PA. The common voltage supply line 10 may include a first common voltage input unit (e.g., a first common voltage input part or line) 11, a second common voltage input unit (e.g., a second common voltage input part or line) 12, and a third common voltage input unit (e.g., a third common voltage input part or line) 13, which are arranged to be adjacent to a first edge E1 of the display area DA. The first common voltage input unit 11 and the second common voltage input unit 12 may be arranged to be spaced apart from each other, and the third common voltage input unit 13 may be located between the first common voltage input unit 11 and the second common voltage input unit 12. The third common voltage input unit 13 may be spaced apart from the first common voltage input unit 11 and the second common voltage input unit 12. The first common voltage input unit 11 and the second common voltage input unit 12 may be arranged at opposite sides (e.g., opposite ends) of the first edge E1 of the display area DA, respectively, and the third common voltage input unit 13 may be arranged in the middle (e.g., at a central portion) of the first edge E1 of the display area DA.

The first common voltage input unit 11 and the second common voltage input unit 12 may be connected to each other by a body portion 14, which extends along a second edge E2, a third edge E3, and a fourth edge E4 of the display area DA. In other words, the first common voltage input unit 11, the second common voltage input unit 12, and the body portion 14 may be integrally provided as a single body.

The common voltage division line 20 may branch from the first common voltage input unit 11 and the second common voltage input unit 12, and may extend along the second edge E2, the third edge E3, and the fourth edge E4. For example, the common voltage division line 20 may include a first division line 21, a second division line 22, and a third division line 23. The first division line 21 may extend along the third edge E3 of the display area DA from the first common voltage input unit 11, and the second division line 22 may extend along the fourth edge E4 of the display area DA from the second common voltage input unit 12. The first division line 21 and the second division line 22 may be connected to each other by the third division line 23, which extends along the second edge E2 of the display area DA. In other words, the first division line 21, the second division line 22, and the third division line 23 may be integrally provided as a single body.

The common voltage supply line 10 and the common voltage division line 20 may be electrically connected to the common voltage line 1200, which passes through (e.g., extends across) the display area DA. The common voltage line 1200 may include a first common voltage line 1230 and a second common voltage line 1220. The first common voltage line 1230 extends in a first direction (e.g., the y direction), and the second common voltage line 1220 extends in a second direction (e.g., the x direction). Some of the first common voltage lines 1230 may extend toward the display area DA from the first to third common voltage input units 11, 12, and 13. For example, a first common voltage line 1230 may cross the display area DA in the first direction (e.g., the y direction) to connect the third common voltage input unit 13 and a portion of the third division line 23 facing the third common voltage input unit 13 to each other. Another first common voltage line 1230 may cross the display area DA in the first direction to connect the first common voltage input unit 11 and a portion of the third division line 23 facing the first common voltage input unit 11 to each other. Similarly, another first common voltage line 1230 may cross the display area DA in the first direction to connect the second common voltage input unit 12 and a portion of the third division line 23 facing the second common voltage input unit 12 to each other. The second common voltage line 1220 may cross the display area DA in the second direction (e.g., the x direction) to connect the first division line 21 and the second division line 22 facing the first division line 21 to each other. The first common voltage lines 1230 extending in the first direction may be electrically connected to the second common voltage line 1220 extending in the second direction (e.g., the x direction), which crosses the first direction.

When the common voltage supply line 10 includes the third common voltage input unit 13 between the first and second common voltage input units 11 and 12, and a current is applied, current density may be reduced and heat generation may be suppressed, compared to a case in which the first and second common voltage input units 11 and 12 are provided without the third common voltage input unit 13.

The driving voltage supply line 30 is arranged at (e.g., in or on) the peripheral area PA, and may be electrically connected to the driving voltage line PL crossing the display area DA in the first direction. In an embodiment, the driving voltage supply line 30 may include first and second driving voltage input units 31 and 32, which are arranged at opposite sides from each other with the third common voltage input unit 13 therebetween.

The first and second driving circuits 41 and 43 are arranged at (e.g., in or on) the peripheral area PA, and may be electrically connected to the scan line SL or the emission control line EL. In an embodiment, some of the scan lines SL may be electrically connected to the first driving circuit 41, and others of the scan lines SL may be connected to the second driving circuit 43. The first and second driving circuits 41 and 43 may generate a scan signal, and the generated scan signal may be transmitted to a transistor electrically connected to the light-emitting diode via the scan line SL. In an embodiment, one of the first and second driving circuits 41 and 43 may include an emission control driving circuit. For example, as shown in FIG. 1, the first driving circuit 41 may include an emission control driving circuit, and may transmit an emission control signal to a transistor electrically connected to the light-emitting diode via the emission control line EL. In FIG. 1, the emission control driving circuit is arranged at one side of the display area DA, but a plurality of emission control driving circuits may be arranged at opposite sides with the display area DA therebetween.

The data driving circuit 50 may be arranged at (e.g., in or on) the sub-area SR. The data driving circuit 50 may transmit a data signal to a transistor electrically connected to the light-emitting diode via the data line DL.

A first terminal unit (e.g., a first terminal area) TD1 may be located at one side of the substrate 100 (e.g., at an end of the sub-area SR). A printed circuit board 60 may be attached to the first terminal unit TD1. The printed circuit board 60 may include a second terminal unit (e.g., a second terminal area) TD2 electrically connected to the first terminal unit TD1, and a controller 70 may be disposed on (e.g., over) the printed circuit board 60. Control signals of the controller 70 may be provided to the first and second driving circuits 41 and 42, the data driving circuit 50, the driving voltage supply line 30, and the common voltage supply line 10 via the first and second terminal units TD1 and TD2.

Figure 3:
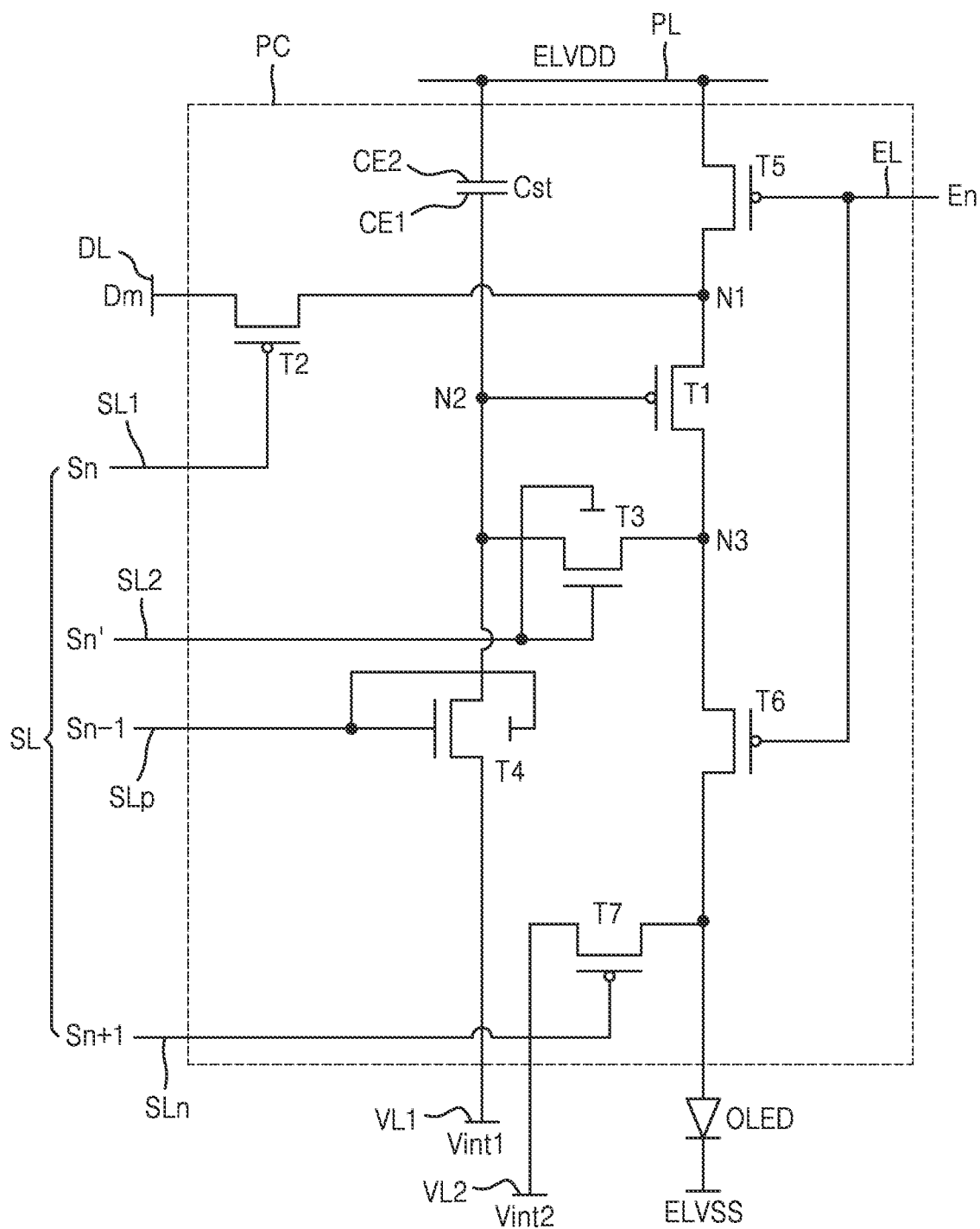
FIG. 3 is an equivalent circuit diagram schematically illustrating a pixel circuit electrically connected to a light-emitting diode of a display apparatus, according to an embodiment.

FIG. 3 is an equivalent circuit diagram schematically illustrating a pixel circuit PC electrically connected to a light-emitting diode OLED, which corresponds to a pixel of a display apparatus, according to an embodiment.

As shown in FIG. 3, the pixel circuit PC may include a plurality of thin-film transistors T1 to T7 and a storage capacitor Cst. The thin-film transistors T1 to T7 and the storage capacitor Cst may be connected to signal lines SL1, SL2, SLp, SLn, EL, and DL, a first initialization voltage line VL1, a second initialization voltage line VL2, and a driving voltage line PL. At least one of the lines (e.g., the driving voltage line PL) may be shared by pixel circuits PC that are adjacent to each other.

The thin-film transistors T1 to T7 may include a driving transistor T1, a switching transistor T2, a compensation transistor T3, a first initialization transistor T4, an operation control transistor T5, an emission control transistor T6, and a second initialization transistor T7.

In an embodiment, the light-emitting diode OLED may be an organic light-emitting diode OLED. The organic light-emitting diode OLED may include a pixel electrode and an opposite electrode. The pixel electrode may be connected to the driving transistor T1 via the emission control transistor T6, and may receive a driving current. The opposite electrode may receive a common voltage ELVSS. The organic light-emitting diode OLED may generate light having a desired luminance corresponding to the driving current.

Some of the thin-film transistors T1 to T7 may be n-channel metal-oxide-semiconductor field-effect transistors (MOSFETs) (NMOS transistors), and others may be p-channel MOSFETs (PMOS transistors). For example, from among the thin-film transistors T1 to T7, the compensation transistor T3 and the first initialization transistor T4 may be NMOS transistors, and the others may be PMOS transistors. In some embodiments, from among the thin-film transistors T1 to T7, the compensation transistor T3, the first initialization transistor T4, and the second initialization transistor T7 may be NMOS transistors, and the others may be PMOS transistors. In some embodiments, the thin-film transistors T1 to T7 may all be NMOS transistors or PMOS transistors. The thin-film transistors T1 to T7 may include amorphous silicon or polysilicon. If desired, a thin-film transistor that is an NMOS transistor may include an oxide semiconductor. Hereinafter, for convenience, the compensation transistor T3 and the first initialization transistor T4 are described in more detail as NMOS transistors, which include an oxide semiconductor, and the others are described in more detail as PMOS transistors.

The signal lines may include a first scan line SL1 configured to transmit a first scan signal Sn, a second scan line SL2 configured to transmit a second scan signal Sn', a previous scan line SLp configured to transmit a previous scan signal Sn−1 to the first initialization transistor T4, a next scan line SLn configured to transmit a next scan signal Sn+1 to the second initialization transistor T7, the emission control line EL configured to transmit an emission control signal En to the operation control transistor T5 and the emission control transistor T6, and the data line DL crossing the first scan line and configured to transmit a data signal Dm.

The driving voltage line PL may be configured to transmit a driving voltage ELVDD to the driving transistor T1, the first initialization voltage line VL1 may be configured to transmit a first initialization voltage Vint1 for initializing the driving transistor T1, and the second initialization voltage line VL2 may be configured to transmit a second initialization voltage Vint2 for initializing the pixel electrode of the organic light-emitting diode OLED.

A driving gate electrode of the driving transistor T1 may be connected to the storage capacitor Cst via a second node N2. One of a source area and a drain area of the driving transistor T1 may be connected to the driving voltage line PL via the operation control transistor T5 and a first node N1, and the other one of the source area and the drain area of the driving transistor T1 may be electrically connected to the pixel electrode of the organic light-emitting diode OLED via the emission control transistor T6 and a third node N3. The driving transistor T1 may receive the data signal Dm in response to a switching operation of the switching transistor T2, and may supply a driving current to the organic light-emitting diode OLED. In other words, in response to a voltage (e.g., that varies according to the data signal Dm) applied to the second node N2, the driving transistor T1 may control an amount of current flowing to the organic light-emitting diode OLED from the first node N1 electrically connected to the driving voltage line PL.

A switching gate electrode of the switching transistor T2 may be connected to the first scan line SL1 configured to transmit the first scan signal Sn. One of a source area and a drain area of the switching transistor T2 may be connected to the data line DL, and the other one of the source area and the drain area of the switching transistor T2 may be connected to the driving transistor T1 via the first node N1 and to the driving voltage line PL via the operation control transistor T5. The switching transistor T2 may be configured to transmit the data signal Dm from the data line DL to the first node N1, in response to a voltage applied to the first scan line SL1. In other words, the switching transistor T2 may be turned on in response to the first scan signal Sn received via the first scan line SL1, and may perform a switching operation for transmitting the data signal Dm received via the data line DL to the driving transistor T1 via the first node N1.

A compensation gate electrode of the compensation transistor T3 may be connected to the second scan line SL2. One of a source area and a drain area of the compensation transistor T3 may be connected to the pixel electrode of the organic light-emitting diode OLED via the emission control transistor T6 and the third node N3. The other one of the source area and the drain area of the compensation transistor T3 may be connected to a first capacitor electrode CE1 of the storage capacitor Cst and to the driving gate electrode of the driving transistor T1 via the second node N2. The compensation transistor T3 may be turned on in response to the second scan signal Sn' received via the second scan line SL2, and may diode-connect the driving transistor T1.

A first initialization gate electrode of the first initialization transistor T4 may be connected to the previous scan line SLp. One of a source area and a drain area of the first initialization transistor T4 may be connected to the first initialization voltage line VL1. The other one of the source area and the drain area of the first initialization transistor T4 may be connected to the first capacitor electrode CE1 of the storage capacitor Cst and to the driving gate electrode of the driving transistor T1 via the second node N2. The first initialization transistor T4 may apply the first initialization voltage Vint1 from the first initialization voltage line VL1 to the second node N2, in response to a voltage applied to the previous scan line SLp. In other words, the first initialization transistor T4 may be turned on in response to the previous scan signal Sn−1 received via the previous scan line SLp, and may transmit the first initialization voltage Vint1 to the driving gate electrode of the driving transistor T1 to perform an initialization operation for initializing a voltage of the driving gate electrode of the driving transistor T1.

An operation control gate electrode of the operation control transistor T5 may be connected to the emission control line EL. One of a source area and a drain area of the operation control transistor T5 may be connected to the driving voltage line PL, and the other one may be connected to the driving transistor T1 and the switching transistor T2 via the first node N1.

An emission control gate electrode of the emission control transistor T6 may be connected to the emission control line EL. One of a source area and a drain area of the emission control transistor T6 may be connected to the driving transistor T1 and to the compensation transistor T3 via the third node N3, and the other one of the source area and the drain area of the emission control transistor T6 may be electrically connected to the pixel electrode of the organic light-emitting diode OLED.

The operation control transistor T5 and the emission control transistor T6 may be concurrently (e.g., simultaneously) turned on in response to the emission control signal En received via the emission control line EL, so that the driving voltage ELVDD is transmitted to the operation control transistor T5 and a driving current flows in the organic light-emitting diode OLED.

A second initialization gate electrode of the second initialization transistor T7 may be connected to the next scan line SLn. One of a source area and a drain area of the second initialization transistor T7 may be connected to the pixel electrode of the organic light-emitting diode OLED, and the other one of the source area and the drain area of the second initialization transistor T7 may be connected to the second initialization voltage line VL2 to receive the second initialization voltage Vint2. The second initialization transistor T7 may be turned on in response to the next scan signal Sn+1 received via the next scan line SLn, to initialize the pixel electrode of the organic light-emitting diode OLED. The next scan line SLn may be the same as the first scan line SL1. In this case, the corresponding scan line may transmit the same electrical signal with a time difference and function as those of the first scan line SL1 or the next scan line SLn. In other words, the next scan line SLn may include a first scan line of another pixel circuit that is adjacent to the pixel circuit PC shown in FIG. 3, and electrically connected to the data line DL (e.g., the same data line DL) as that to which the pixel circuit PC is connected.

The second initialization transistor T7 may be connected to the next scan line SLn, as shown in FIG. 3. However, the present disclosure is not limited thereto, and the second initialization transistor T7 may be connected to the emission control line EL to be driven according to the emission control signal En.

The storage capacitor Cst may include the first capacitor electrode CE1 and a second capacitor electrode CE2. The first capacitor electrode CE1 of the storage capacitor Cst may be connected to the driving gate electrode of the driving transistor T1 via the second node N2, and the second capacitor electrode CE2 of the storage capacitor Cst may be connected to the driving voltage line PL. The storage capacitor Cst may store a charge corresponding to a voltage difference between a voltage of the driving gate electrode of the driving transistor T1 and the driving voltage ELVDD.

Specific operations of the pixel circuit PC and the organic light-emitting diode OLED according to an embodiment are described in more detail below.

During an initialization period, when the previous scan signal Sn−1 is received via the previous scan line SLp, the first initialization transistor T4 may be turned on in response to the previous scan signal Sn−1, and the driving transistor T1 is initialized by the first initialization voltage Vint1 received via the first initialization voltage line VL1.

During a data programming period, when the first scan signal Sn and the second scan signal Sn' are received via the first scan line SL1 and the second scan line SL2, respectively, the switching transistor T2 and the compensation transistor T3 may be turned on in response to the first scan signal Sn and the second scan signal Sn', respectively. In this case, the driving transistor T1 may be diode-connected by the compensation transistor T3 that is turned on, and may be biased in a forward direction. Then, a compensation voltage (e.g., Dm+Vth, where Vth has a negative value), which is obtained by subtracting the data signal Dm received via the data line DL by a threshold voltage (Vth) of the driving transistor T1, may be applied to the driving gate electrode G1 of the driving transistor T1. The driving voltage ELVDD and the compensation voltage (e.g., Dm+Vth) may be applied to opposite ends of the storage capacitor Cst, respectively, and a charge corresponding to a voltage difference between the opposite ends may be stored in the storage capacitor Cst.

During an emission period, the operation control transistor T5 and the emission control transistor T6 may be turned on by the emission control signal En received via the emission control line EL. A driving current corresponding to a voltage difference between the voltage of the driving gate electrode of the driving transistor T1 and the driving voltage ELVDD may be generated, and the driving current may be supplied to the organic light-emitting diode OLED via the emission control transistor T6.

As described above, some of the thin-film transistors T1 to T7 may include an oxide semiconductor. For example, the compensation transistor T3 and the first initialization transistor T4 may each include an oxide semiconductor.

In case of polysilicon, because polysilicon is highly reliable, it may be precisely controlled so that an intended current flows therein. Therefore, when the driving transistor T1, which directly affects a brightness of the display apparatus, includes a semiconductor layer including polysilicon that is highly reliable, a high-resolution display apparatus may be implemented. Meanwhile, the oxide semiconductor has high carrier mobility and low leakage current, and thus, a voltage drop may not be large even when a driving time is long. In other words, for the oxide semiconductor, a color change of a pixel according to the voltage drop may not be large, and thus, low-frequency driving may be possible. Therefore, when the compensation transistor T3 and the first initialization transistor T4 include an oxide semiconductor, a display apparatus may be implemented in which a leakage current is prevented or substantially prevented from occurring and power consumption is reduced.

Because such an oxide semiconductor is sensitive to light, a variation in an amount of current or the like may occur due to light from the outside (e.g., external light). Accordingly, a metal layer may be disposed under (e.g., underneath) the oxide semiconductor, so that the external light may be absorbed or reflected. As shown in FIG. 3, in each of the compensation transistor T3 and the first initialization transistor T4 including an oxide semiconductor, a gate electrode may be disposed over and under an oxide semiconductor layer. In other words, when viewed from a direction (e.g., a thickness direction or a z direction) perpendicular to or substantially perpendicular to an upper surface of the substrate 100 (e.g., in a plan view), the metal layer disposed under the oxide semiconductor may overlap with the oxide semiconductor.

Figure 4:
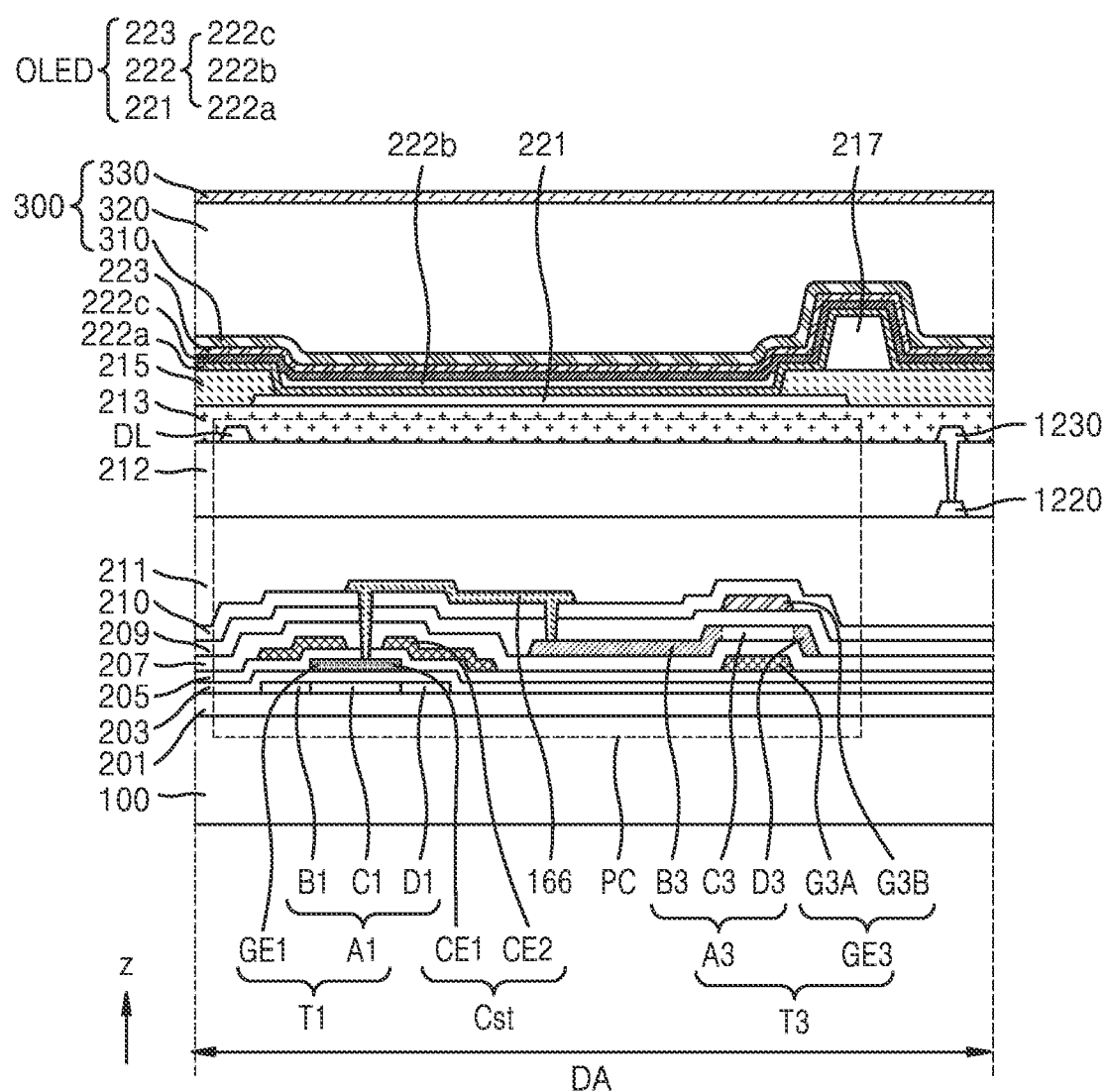
FIG. 4 is a cross-sectional view schematically illustrating a pixel circuit electrically connected to a light-emitting diode of a display apparatus, according to an embodiment.

FIG. 4 is a cross-sectional view schematically illustrating a pixel circuit PC electrically connected to a light-emitting element OLED of a display apparatus, according to an embodiment.

Referring to FIG. 4, an organic light-emitting diode OLED may be arranged at (e.g., in or on) the display area DA, and may be electrically connected to the pixel circuit PC located between the substrate 100 and the organic light-emitting diode OLED in the thickness direction (e.g., the z direction) perpendicular to or substantially perpendicular to the substrate 100.

The substrate 100 may include a glass material or a polymer resin. In an embodiment, the substrate 100 may have an alternating stacked structure including a base layer and a barrier layer. The base layer may include a polymer resin, and the barrier layer may include an inorganic insulating material, such as silicon oxide or silicon nitride. For example, the polymer resin may include polyether sulfone, polyarylate, polyetherimide, polyethylene naphthalate, polyethylene terephthalate, polyphenylene sulfide, polyimide, polycarbonate, cellulose triacetate, and/or cellulose acetate propionate.

Before the pixel circuit PC is provided, a buffer layer 201 may be provided on (e.g., over) the substrate 100 to prevent or substantially prevent impurities from permeating into the pixel circuit PC. The buffer layer 201 may include an inorganic insulating material, such as silicon nitride, silicon oxynitride, and/or silicon oxide, and may include a layer or a plurality of layers including the inorganic insulating material.

As described above with reference to FIG. 3, the pixel circuit PC may include the plurality of transistors and the storage capacitor, and FIG. 4 illustrates the driving transistor T1 and the compensation transistor T3 from among the plurality of transistors, and the storage capacitor Cst.

The driving transistor T1 may include a semiconductor layer (hereinafter, referred to as "a driving semiconductor layer") A1, and a driving gate electrode GE1. The driving semiconductor layer A1 may be disposed on (e.g., over) the buffer layer 201, and the driving gate electrode GE1 may overlap with a channel area C1 of the driving semiconductor layer A1. The driving semiconductor layer A1 may include a silicon-based semiconductor material, such as polysilicon. The driving semiconductor layer A1 may include the channel area C1, a first area B1, and a second area D1. The first area B1 and the second area D1 may be arranged at opposite sides of the channel area C1, respectively. The first area B1 and the second area D1 are areas having a greater concentration of impurities than that of the channel area C1. One of the first area B1 and the second area D1 may correspond to a source area, and the other one may correspond to a drain area.

A first gate insulating layer 203 may be between the driving semiconductor layer A1 and the driving gate electrode GE1. The first gate insulating layer 203 may include an inorganic insulating material, such as silicon oxide ($SiO_x$), silicon nitride ($SiN_x$), and/or silicon oxynitride (SiON), and may include a layer or a plurality of layers including the inorganic insulating material.

The driving gate electrode GE1 may include a conductive material, such as molybdenum (Mo), aluminum (Al), copper (Cu), and/or titanium (Ti), and may include a layer or a plurality of layers including the conductive material.

The storage capacitor Cst may include the first capacitor electrode CE1 and the second capacitor electrode CE2, which overlap with each other. In an embodiment, the first capacitor electrode CE1 of the storage capacitor Cst may include the driving gate electrode GE1. In other words, the driving gate electrode GE1 may include the first capacitor electrode CE1 of the storage capacitor Cst. For example, the driving gate electrode GE1 and the first capacitor electrode CE1 of the storage capacitor Cst may be integrally provided as a single body.

A first interlayer insulating layer 205 may be between the first capacitor electrode CE1 and the second capacitor electrode CE2 of the storage capacitor Cst. The first interlayer insulating layer 205 may include an inorganic insulating material, such as $SiO_x$, $SiN_x$, and/or SiON, and may include a layer or a plurality of layers including the inorganic insulating material.

The second capacitor electrode CE2 of the storage capacitor Cst may include a low-resistance conductive material, such as Mo, Al, Cu, and/or Ti, and may include a layer or a plurality of layers including the low-resistance conductive material.

A second interlayer insulating layer 207 may be disposed on (e.g., over) the storage capacitor Cst. The second interlayer insulating layer 207 may include an inorganic insulating material, such as $SiO_x$, $SiN_x$, and/or SiON, and may include a layer or a plurality of layers including the inorganic insulating material.

A semiconductor layer (hereinafter, referred to as "a compensation semiconductor layer") A3 of the compensation transistor T3 may be disposed on (e.g., over) the second interlayer insulating layer 207. The compensation semiconductor layer A3 may include an oxide-based semiconductor material. For example, the compensation semiconductor layer A3 may include a zinc (Zn) oxide-based material, such as Zn oxide, In—Zn oxide, and/or Ga—In—Zn oxide. In some embodiments, the compensation semiconductor layer A3 may include In—Ga—Zn—O (IGZO), In—Sn—Zn—O (ITZO), or In—Ga—Sn—Zn—O (IGTZO) semiconductor, in which a metal, such as indium (In), gallium (Ga), and/or tin (Sn), is included in zinc oxide (ZnO).

The compensation semiconductor layer A3 may include a channel area C3, a first area B3, and a second area D3. The first area B3 and the second area D3 may be arranged at opposite sides of the channel area C3, respectively. One of the first area B3 and the second area D3 may correspond to a source area, and the other one may correspond to a drain area.

The compensation transistor T3 may include a compensation gate electrode GE3 overlapping with the channel area C3 of the compensation transistor T3. The compensation gate electrode GE3 may have a dual gate structure including a lower gate electrode G3A and an upper gate electrode G3B. The lower gate electrode G3A may be disposed under (e.g., underneath) the compensation semiconductor layer A3, and the upper gate electrode G3B may be disposed over the channel area C3.

The lower gate electrode G3A may be disposed at (e.g., in or on) the same layer as that of the second capacitor electrode CE2 of the storage capacitor Cst. For example, the lower gate electrode G3A and the second capacitor electrode CE2 may be disposed on the first interlayer insulating layer 205. The lower gate electrode G3A may include the same material as that of the second capacitor electrode CE2 of the storage capacitor Cst.

The upper gate electrode G3B may be disposed on (e.g., over) the compensation semiconductor layer A3 with a second gate insulating layer 209 therebetween. The second gate insulating layer 209 may include an inorganic insulating material, such as $SiO_x$, $SiN_x$, and/or SiON, and may include a layer or a plurality of layers including the inorganic insulating material.

A third interlayer insulating layer 210 may be disposed on (e.g., over) the upper gate electrode G3B. The third interlayer insulating layer 210 may include an inorganic insulating material, such as $SiO_x$, $SiN_x$, and/or SiON, and may include a layer or a plurality of layers including the inorganic insulating material.

The driving transistor T1 and the compensation transistor T3 may be electrically connected to each other by a node connection line 166. The node connection line 166 may be disposed on (e.g., over) the third interlayer insulating layer 210. One side (e.g., one end) of the node connection line 166 may be connected to the driving gate electrode GE1 of the driving transistor T1, and the other side (e.g., the other end) of the node connection line 166 may be connected to the compensation semiconductor layer A3 of the compensation transistor T3.

The node connection line 166 may include Al, Cu, and/or Ti, and may include a layer or a plurality of layers including one or more of these materials. For example, the node connection line 166 may have a three-layer structure of a Ti layer, an Al layer, and another Ti layer.

A first organic insulating layer 211 may be disposed on (e.g., over) the node connection line 166. The first organic insulating layer 211 may include an organic insulating material. The organic insulating material may include benzocyclobutene (BCB), polyimide, and/or hexamethyldisiloxane (HMDSO).

The second common voltage line 1220 may be disposed on (e.g., over) the first organic insulating layer 211. The second common voltage line 1220 may include Al, Cu, and/or Ti, and may include a layer or a plurality of layers including one or more of these materials. For example, the second common voltage line 1220 may have a three-layer structure of a Ti layer, an Al layer, and another Ti layer.

A second organic insulating layer 212 may be disposed on (e.g., over) the second common voltage line 1220. The second organic insulating layer 212 may include an organic material, such as acryl, BCB, polyimide, and/or HMDSO, and the data line DL and the first common voltage line 1230 may be disposed on (e.g., over) the second organic insulating layer 212.

Each of the data line DL and the first common voltage line 1230 may include Al, Cu, and/or Ti, and may include a layer or a plurality of layers including one or more of these materials. For example, each of the data line DL and the first common voltage line 1230 may have a three-layer structure of a Ti layer, an Al layer, and another Ti layer.

The first common voltage line 1230 may be electrically connected to the second common voltage line 1220, which is disposed at (e.g., in or on) a different layer from that of the first common voltage line 1230. For example, the second common voltage line 1220 may be disposed on (e.g., over) the first organic insulating layer 211, and may be electrically connected to the first common voltage line 1230 via a hole passing through (e.g., penetrating) the second organic insulating layer 212. A mesh covering at least part of the display area DA may be provided through an electrical connection between the first common voltage line 1230 and the second common voltage line 1220, and thus, heat generation due to a resistance of the first common voltage line 1230 itself may be prevented, minimized, or reduced.

A third organic insulating layer 213 may be disposed on (e.g., over) the data line DL and the first common voltage line 1230. The third organic insulating layer 213 may include an organic insulating material, such as acryl, BCB, polyimide, and/or HMDSO.

A light-emitting diode, for example, the organic light-emitting diode OLED, may be disposed on (e.g., over) the third organic insulating layer 213. A pixel electrode 221 of the organic light-emitting diode OLED may include a reflective film including silver (Ag), magnesium (Mg), Al, platinum (Pt), palladium (Pd), gold (Au), nickel (Ni), neodymium (Nd), iridium (Ir), chromium (Cr), or a suitable combination thereof. In another embodiment, the pixel electrode 221 may further include a conductive oxide layer over and/or under the reflective film described above. The conductive oxide layer may include indium tin oxide (ITO), indium zinc oxide (IZO), ZnO, indium oxide ($In_2O_3$), indium gallium oxide (IGO), and/or aluminum zinc oxide (AZO). In an embodiment, the pixel electrode 221 may have a three-layer structure of an ITO layer, an Ag layer, and another ITO layer.

A bank layer 215 may be disposed on (e.g., over) the pixel electrode 221. The bank layer 215 includes an opening overlapping with (e.g., to expose) the pixel electrode 221, and may cover an edge of the pixel electrode 221. The bank layer 215 may include an organic insulating material.

An intermediate layer 222 of the organic light-emitting diode OLED may be disposed on (e.g., over) the pixel electrode 221. The intermediate layer 222 may include an emission layer 222b. The intermediate layer 222 may include a first functional layer 222a and a second functional layer 222c. The first functional layer 222a may be disposed under (e.g., underneath) the emission layer 222b, and the second functional layer 222c may be disposed over the emission layer 222b. The emission layer 222b may include a polymer organic material or a low-molecular weight organic material that emits light of a desired color. The second functional layer 222c may include an electron transport layer (ETL) and/or an electron injection layer (EIL). Each of the first functional layer 222a and the second functional layer 222c may include an organic material.

An opposite electrode 223 of the organic light-emitting diode OLED may be disposed on (e.g., over) the intermediate layer 222. The opposite electrode 223 may include a conductive material having a low work function. For example, the opposite electrode 223 may include a (semi-)transparent layer including Ag, Mg, Al, Pt, Pd, Au, Ni, Nd, Ir, Cr, Li, calcium (Ca), or a suitable alloy thereof. In some embodiments, the opposite electrode 223 may further include, for example, an ITO layer, an IZO layer, a ZnO layer, or an $In_2O_3$ layer on (e.g., over) the (semi-)transparent layer including one or more of the materials described above.

The emission layer 222b may be provided at (e.g., in or on) the display area DA to overlap with the pixel electrode 221 through the opening of the bank layer 215. Unlike the emission layer 222b, each of the first functional layer 222a, the second functional layer 222c, and the opposite electrode 223 may commonly cover (e.g., may fully cover) the display area DA.

A spacer 217 may be disposed on (e.g., over) the bank layer 215. The spacer 217 and the bank layer 215 may be provided together in the same or substantially the same process, or may be individually provided in separate processes from each other. In an embodiment, the spacer 217 may include an organic insulating material, such as polyimide.

The organic light-emitting diode OLED may be covered with an encapsulation layer 300. The encapsulation layer 300 may include at least one organic encapsulation layer, and at least one inorganic encapsulation layer. In an embodiment, as shown in FIG. 4, the encapsulation layer 300 may include first and second inorganic encapsulation layers 310 and 330, and an organic encapsulation layer 320 therebetween.

Each of the first inorganic encapsulation layer 310 and the second inorganic encapsulation layer 330 may include one or more inorganic materials from among aluminum oxide, titanium oxide, tantalum oxide, hafnium oxide, ZnO, $SiO_x$, SiN$_x$, and SiON. Each of the first inorganic encapsulation layer 310 and the second inorganic encapsulation layer 330 may include a layer or a plurality of layers including one or more of the inorganic materials described above. The organic encapsulation layer 320 may include a polymer-based material. The polymer-based material may include an acryl-based resin, an epoxy-based resin, polyimide, polyethylene, and/or the like. In an embodiment, the organic encapsulation layer 320 may include acrylate.

Figure 5:
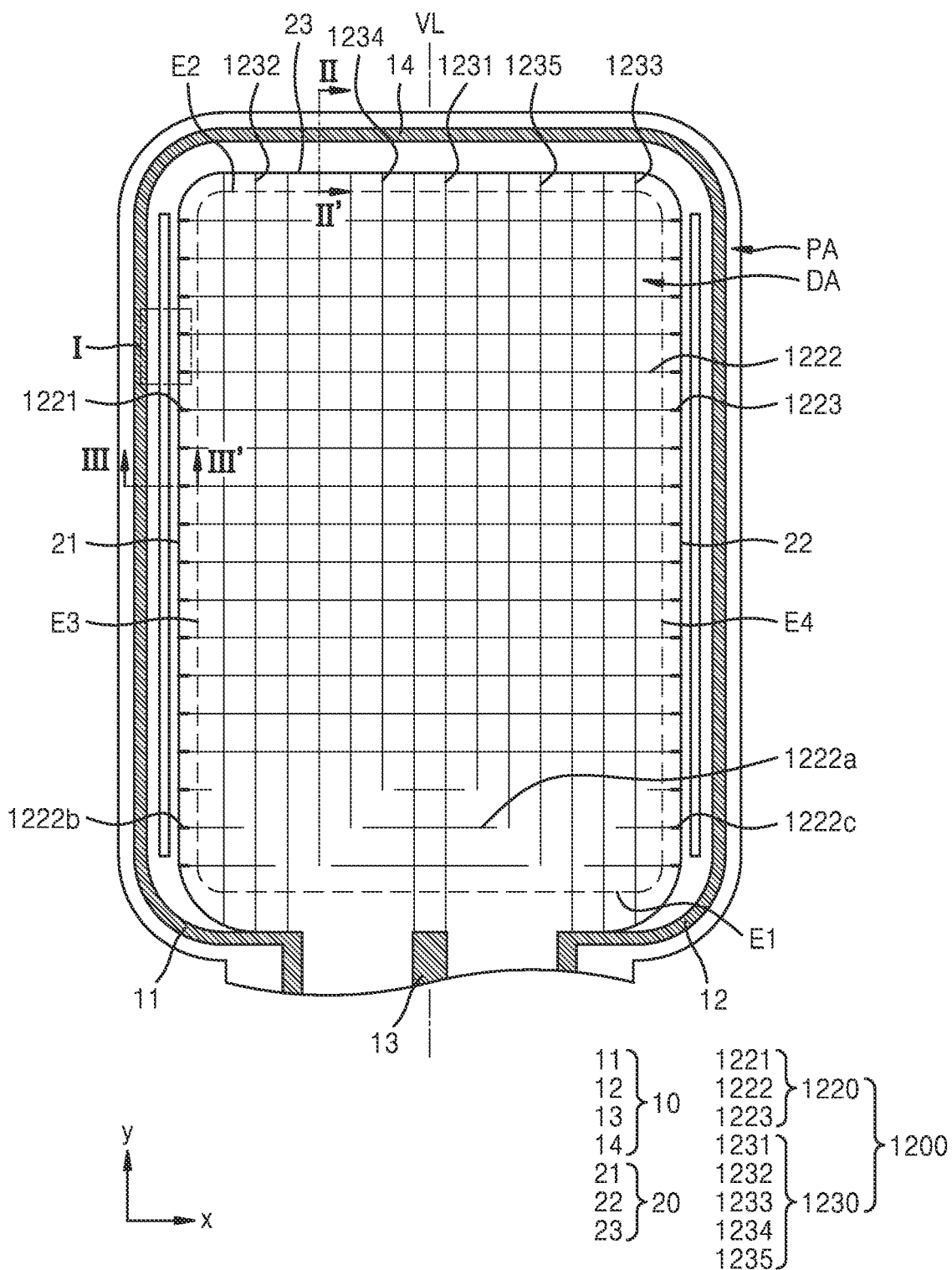
FIG. 5 is a plan view of a display apparatus and illustrates common voltage lines, according to an embodiment.
Figure 6:
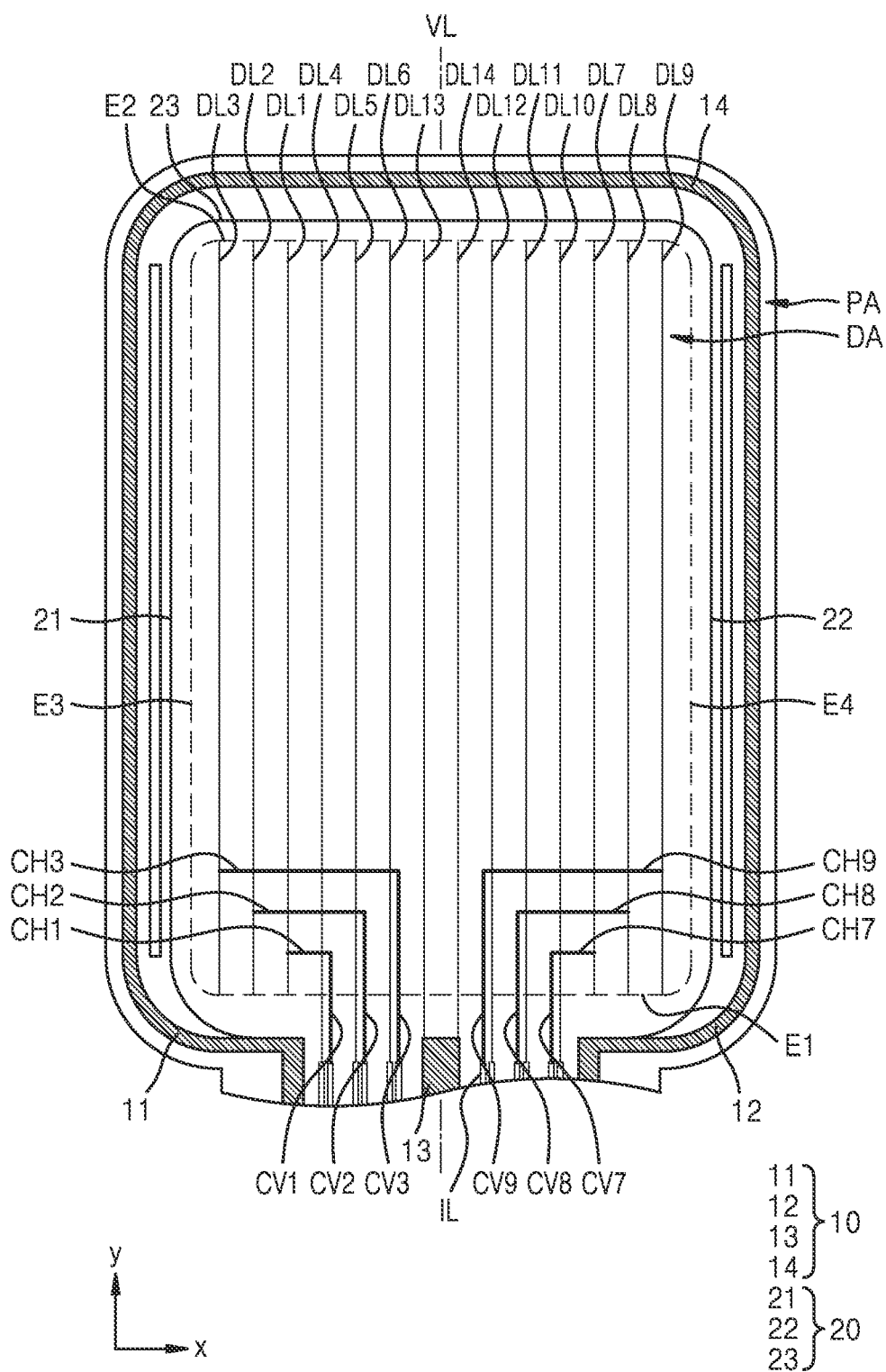
FIG. 6 is a plan view of a display apparatus and illustrates data lines and connection lines, according to an embodiment.

FIG. 5 is a plan view of a display apparatus and illustrates common voltage lines, according to an embodiment, and FIG. 6 is a plan view of a display apparatus and illustrates data lines and connection lines, according to an embodiment.

The first common voltage input unit 11, the second common voltage input unit 12, and the third common voltage input unit 13 of the common voltage supply line 10 may be arranged on the same side as each other with respect to the display area DA. For example, the first common voltage input unit 11, the second common voltage input unit 12, and the third common voltage input unit 13 may be arranged to be adjacent to the first edge E1 of the display area DA, as described above with reference to FIG. 1.

As described above, the common voltage division line 20 may branch from the first common voltage input unit 11 and the second common voltage input unit 12, and may extend along the second edge E2, the third edge E3, and the fourth edge E4 of the display area DA. For example, the first division line 21 may extend along the third edge E3 of the display area DA from the first common voltage input unit 11, and the second division line 22 may extend along the fourth edge E4 of the display area DA from the second common voltage input unit 12. The first division line 21 and the second division line 22 may be connected to each other by the third division line 23 extending along the second edge E2 of the display area DA.

Referring to FIG. 5, the common voltage line 1200 may include the first common voltage line 1230 and the second common voltage line 1220. The first common voltage line 1230 may extend in the first direction (e.g., the y direction), and the second common voltage line 1220 may extend in the second direction (e.g., the x direction). At least one end of the first common voltage line 1230 may be electrically connected to the common voltage division line 20. The first common voltage line 1230 and the second common voltage line 1220 may constitute a mesh structure that covers at least part of the display area DA, and thus, current density may be reduced and heat generation may be suppressed, when a common voltage is applied.

Hereinafter, for convenience, the first common voltage line 1230 electrically connected to the third division line 23 across the display area DA from the third common voltage input unit 13 is referred to as a first vertical voltage line 1231. The first common voltage line 1230 electrically connected to the third division line 23 across the display area DA from the first common voltage input unit 11 is referred to as a second vertical voltage line 1232. The first common voltage line 1230 electrically connected to the third division line 23 across the display area DA from the second common voltage input unit 12 is referred to as a third vertical voltage line 1233. The first common voltage line 1230 arranged between a group of the first vertical voltage lines 1231 and a group of second vertical voltage lines 1232 is referred to as a fourth vertical voltage line 1234. The first common voltage line 1230 arranged between a group of first vertical voltage lines 1231 and a group of third vertical voltage lines is referred to as a fifth vertical voltage line 1235.

Each of the fourth vertical voltage line 1234 and the fifth vertical voltage line 1235 may have a length (e.g., in the y direction) that less than those of the first vertical voltage line 1231, the second vertical voltage line 1232, and the third vertical voltage line 1233. For example, each of the fourth vertical voltage line 1234 and the fifth vertical voltage line 1235 may be adjacent to the second edge E2 of the display area DA, and may extend toward the display area DA from the third division line 23. An end of each of the fourth vertical voltage line 1234 and the fifth vertical voltage line 1235 may be closer to a central portion of the display area DA than the first edge E1 of the display area DA. For example, as shown in FIG. 6, vertical connection lines (CV) may be arranged between the ends of the fourth vertical voltage line 1234 and data input lines IL, and between the ends of the fifth vertical voltage line 1235 and the data input lines IL. For example, the fourth vertical voltage line 1234 and a vertical connection line (e.g., CV3) corresponding thereto may be arranged in a straight line, and the fifth vertical voltage line 1235 and a vertical connection line (e.g., CV7) corresponding thereto may be arranged in a straight line. The end of the fourth vertical voltage line 1234 and the vertical connection line (e.g., CV3) arranged on the same straight line as a line in which the fourth vertical voltage line 1234 is arranged may be spaced apart from each other by a suitable distance (e.g., a certain or predetermined distance), and the end of the fifth vertical voltage line 1235 and the vertical connection line (e.g., CV7) arranged on the same straight line as a line in which the fifth vertical voltage line 1235 is arranged may be spaced apart from each other by a suitable distance (e.g., a certain or predetermined distance).

The second common voltage lines 1220 may each extend from the first division line 21 to the second division line 22 in the second direction (e.g., the x direction) crossing the first direction (e.g., the y direction). In an embodiment, the second common voltage line 1220 may include a first horizontal connection portion 1221, a second horizontal connection portion 1223, and a horizontal voltage line 1222. The first horizontal connection portion 1221 protrudes in the second direction from the first division line 21, and the second horizontal connection portion 1223 protrudes in an opposite direction (e.g., a (−x) direction) of the second direction from the second division line 22. The horizontal voltage line 1222 connects the first horizontal connection portion 1221 and the second horizontal connection portion 1223 to each other. For example, the first horizontal connection portion 1221 and the second horizontal connection portion 1223 may be disposed at (e.g., in or on) the same layer (e.g., on the second organic insulating layer 212 as shown in FIG. 4) as that of the common voltage division line 20, and the horizontal voltage line 1222 may be disposed at (e.g., in or on) a different layer (e.g., the first organic insulating layer 211 shown in FIG. 4) from that of the common voltage division line 20. In an embodiment, the first horizontal connection portion 1221 may be integrally provided as a single body with the first division line 21, the second horizontal connection portion 1223 may be provided as a single body with the second division line 22, and the horizontal voltage line 1222 may be electrically connected to the first horizontal connection portion 1221 and the second horizontal connection portion 1223 via a hole defined in the second organic insulating layer 212.

In an embodiment, the horizontal voltage lines 1222 that are adjacent to the first edge E1 of the display area DA may be divided into a first portion 1222a, a second portion 1222b, and a third portion 1222c. The first portion 1222a is electrically connected to the first vertical voltage line 1231, the second portion 1222*b* is electrically connected to the first division line 21, and the third portion 1222*c* is electrically connected to the second division line 22. For example, as shown in FIG. 6, first to third horizontal connection lines CH1 to CH3 may be arranged between the first portion 1222*a* and the second portion 1222*b*, and seventh to ninth horizontal connection lines CH7 to CH9 may be arranged between the first portion 1222*a* and the third portion 1222*c*. Accordingly, the data line DL and the data input line IL may be connected to each other. The first portion 1222*a*, the second portion 1222*b*, and the third portion 1222*c* of the horizontal voltage line 1222 and a corresponding horizontal connection line may be arranged in a straight line, and may be spaced apart from each other by a suitable distance (e.g., a certain or predetermined distance).

Referring to FIG. 6, each of the data lines DL may extend to cross the display area DA in the first direction (e.g., the y direction). As shown, the data lines DL crossing the display area DA may be connected to the data input lines IL arranged at (e.g., in or on) the peripheral area PA. Hereinafter, for convenience, a case in which the data lines DL include first to fourteenth data lines DL1 to DL14 is described in more detail, but the data lines DL may include any suitable number of data lines as would be appreciated by those having ordinary skill in the art.

In an embodiment, when an area of the peripheral area PA is reduced, the data input line IL may be arranged in a space of a portion of the peripheral area PA between the first common voltage input unit 11 and the second common voltage input unit 12.

With respect to a virtual line VL passing through the third common voltage input unit 13, first to sixth data lines DL1 to DL6 may be arranged on the left side of the virtual line VL, and seventh to twelfth data lines DL7 to DL12 may be arranged on the right side of the virtual line VL. For example, the data lines DL may include the first to sixth data lines DL1 to DL6 arranged on the left side of the virtual line VL, the seventh to twelfth data lines DL7 to DL12 arranged on the right side of the virtual line VL, and thirteenth and fourteenth data lines DL13 and DL14 located therebetween.

The first data line DL1 may be electrically connected to the data input line IL via a first vertical connection line CV1 and the first horizontal connection line CH1. The first vertical connection line CV1 and the first horizontal connection line CH1 may be located at (e.g., in or on) the display area DA. The first vertical connection line CV1 may be disposed at (e.g., in or on) the same layer (e.g., on the second organic insulating layer 212 shown in FIG. 4) as that of the first common voltage line 1230. The first vertical connection line CV1 may be disposed at (e.g., in or on) a different layer from that of the data input line IL, and may be connected to the data input line IL via a contact hole passing through at least one insulating layer located between the first vertical connection line CV1 and the data input line IL.

The first horizontal connection line CH1 may be disposed at (e.g., in or on) the same layer (e.g., on the first organic insulating layer 211 shown in FIG. 4) as that of the second common voltage line 1220. The first vertical connection line CV1 and the first horizontal connection line CH1 may be disposed at (e.g., in or on) different layers from each other, and may be connected to each other via a contact hole passing through at least one insulating layer located between the first vertical connection line CV1 and the first horizontal connection line CH1.

The first horizontal connection line CH1 and the first data line DL1 may be disposed at (e.g., in or on) different layers from each other, and may be connected to each other via a contact hole passing through at least one insulating layer located between the first horizontal connection line CH1 and the first data line DL1.

The second data line DL2 may be electrically connected to the data input line IL via a second vertical connection line CV2 and the second horizontal connection line CH2. The second vertical connection line CV2 and the second horizontal connection line CH2 may be disposed at (e.g., in or on) the same layer as those of the first vertical connection line CV1 and the first horizontal connection line CH1, respectively, and may have the same or substantially the same connection structure as that of the first vertical connection line CV1 and the first horizontal connection line CH1.

The third data line DL3 may be electrically connected to the data input line IL via the third vertical connection line CV3 and the third horizontal connection line CH3. The third vertical connection line CV3 and the third horizontal connection line CH3 may be disposed at (e.g., in or on) the same layer as those of the first vertical connection line CV1 and the first horizontal connection line CH1, respectively, and may have the same or substantially the same connection structure thereof.

The first to third horizontal connection lines CH1 to CH3 may differ in length (e.g., in the y direction) from each other. For example, the lengths thereof may increase in an order of the first horizontal connection line CH1, the second horizontal connection line CH2, and the third horizontal connection line CH3. Similarly, the first to third vertical connection lines CV1 to CV3 may differ in length (e.g., in the x direction) from each other. For example, the lengths thereof may increase in the order of the first vertical connection line CV1, the second vertical connection line CV2, and the third vertical connection line CV3.

As described above, the first to third horizontal connection lines CH1 to CH3 may be arranged between the horizontal voltage lines 1222, which are divided and spaced apart from each other. For example, the first to third horizontal connection lines CH1 to CH3 may be arranged between the first portion 1222*a* and the second portion 1222*b* of the horizontal voltage line 1222. Each of the first to third horizontal connection lines CH1 to CH3 and the first to third portions 1222*a*, 1222*b*, and 1222*c* corresponding thereto of the horizontal voltage line 1222 may be arranged in a straight line extending in the second direction (e.g., the x direction), and may be spaced apart from each other.

As described above, the first to third vertical connection lines CV1 to CV3 may be arranged in a straight line extending in the first direction (e.g., the y direction) with the fourth vertical voltage line 1234, and may be spaced apart from each other.

A structure of the seventh to ninth data lines DL7 to DL9 and elements therearound may be the same or substantially the same as those of the first to sixth data lines DL1 to DL6 described above, and thus, redundant description thereof may not be repeated. In some embodiments, as shown in FIGS. 5 and 6, the first to third vertical connection lines CV1 to CV3 and the seventh to ninth vertical connection lines CV7 to CV9 may be symmetrical to or substantially symmetrical to each other with respect to the virtual line VL extending in the first direction through the third common voltage input unit 13. Similarly, the first to third horizontal connection lines CH1 to CH3 and the seventh to ninth horizontal connection lines CH7 to CH9 may be symmetrical to or substantially symmetrical to each other with respect to the virtual line VL.

As described above, a portion of the mesh structure composed of the first common voltage lines 1230 and the second common voltage lines 1220 may be electrically separated, so that the electrically separated portions may be used as connection lines connecting the data lines DL located at a boundary side of the display area DA and the data input lines IL to each other. Thus, an area of the peripheral area PA may be reduced, and when a common voltage is applied, current density may be reduced and heat generation may be suppressed.

Figure 7:
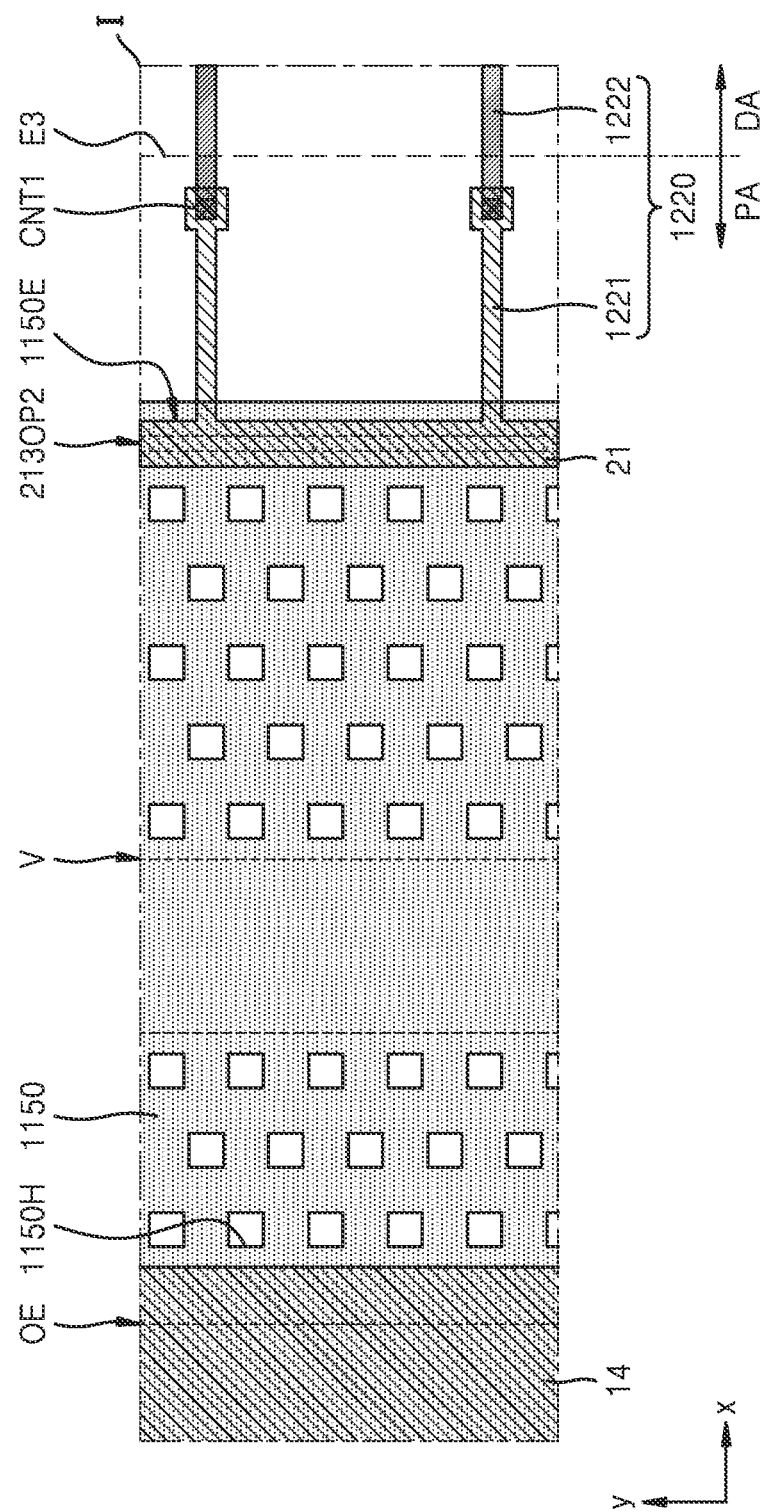
FIG. 7 is an enlarged plan view schematically illustrating a portion of a display apparatus according to an embodiment.
Figure 8:
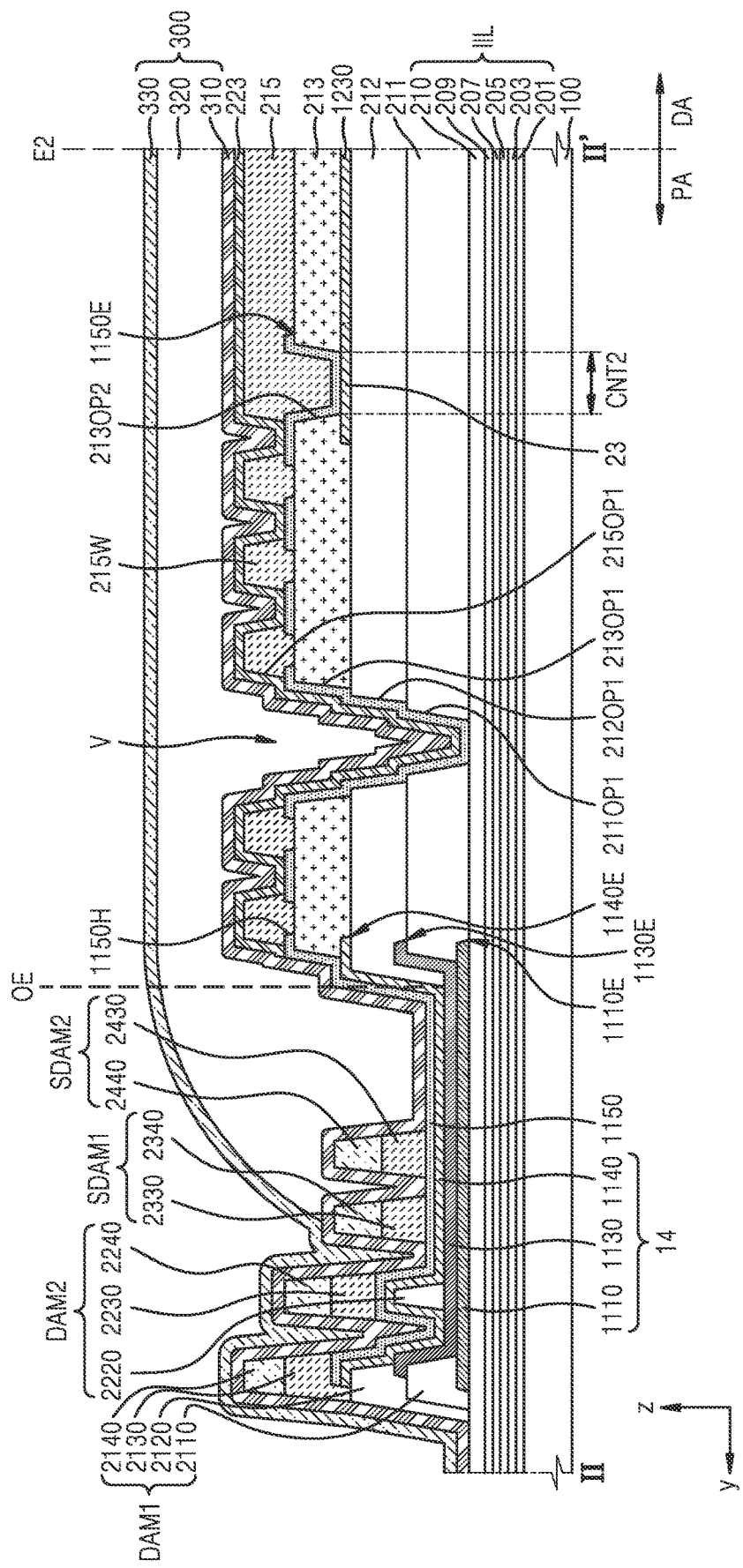
FIGS. 8-9 are cross-sectional views schematically illustrating a portion of a display apparatus.
Figure 9:
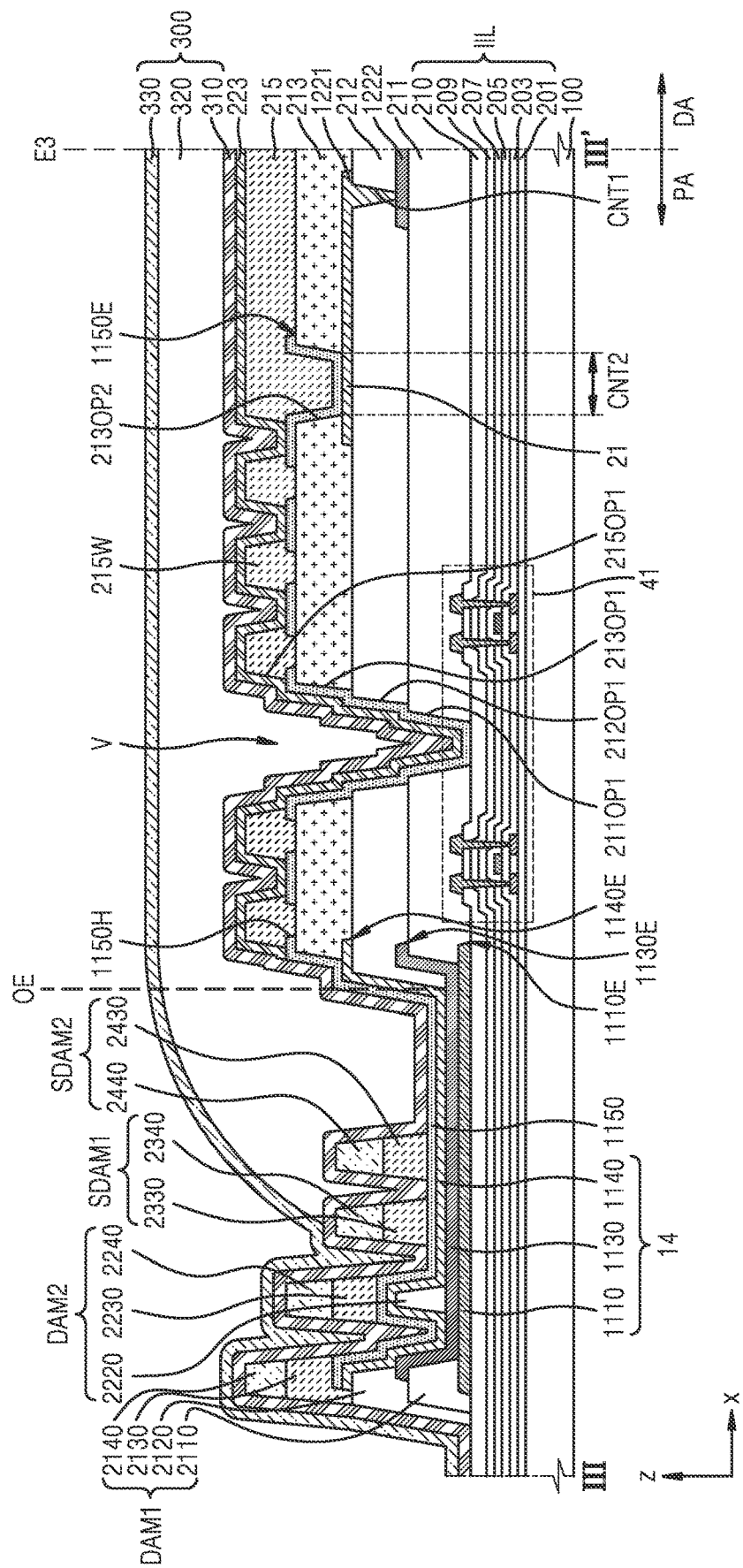

FIG. 7 is an enlarged plan view schematically illustrating a portion of a display apparatus according to an embodiment, and FIGS. 8-9 are cross-sectional views schematically illustrating a portion of a display apparatus. For example, FIG. 7 illustrates the region I in FIG. 5, according to an embodiment, FIG. 8 is a cross-sectional view taken along the line II-II' of FIG. 5, and FIG. 9 is a cross-sectional view taken along the line III-III' of FIG. 5.

FIG. 7 is an enlarged view of a portion of the display area DA and the peripheral area PA from the body portion 14 of the common voltage supply line 10 (e.g., see FIG. 1) arranged along the third edge E3 of the display area DA. For convenience of illustration, the common voltage supply line 10, the common voltage division line 20 (e.g., see FIG. 1), and a portion of metal layers included in the second common voltage line 1220 are shown. For example, FIG. 7 shows the first division line 21, the second common voltage line 1220, a third metal line 1140 (e.g., see FIG. 9), and a metal pattern 1150. The third metal line 1140 is a metal line from among a plurality of metal lines included in the body 14 of the common voltage supply line 10 that is disposed at (e.g., in or on) the same layer as that of the first division line 21, and the metal pattern 1150 covers the body 14 and the first division line 21.

The first division line 21 of the common voltage division line 20 may be arranged in a space between the body portion 14 extending in the first direction (e.g., the y direction) and the third edge E3 of the display area DA. A valley portion V, which is provided by removing a portion of a plurality of organic layers, may be arranged between the body portion 14 and the first division line 21. The valley portion V may be arranged to surround (e.g., around a periphery of) at least part of the display area DA in a continuous manner, so as to block or reduce permeation of moisture into the display area DA from the outside of the substrate 100 through the organic layer. The body portion 14 and the first division line 21 may be arranged to be spaced apart from each other with the valley portion V therebetween, so that a common voltage may be applied to the common voltage lines 1200 (e.g., see FIG. 1) arranged at (e.g., in or on) the display area DA via the first division line 21.

The second common voltage line 1220 may extend in the second direction (e.g., the x direction) to the display area DA from the first division line 21. The second common voltage line 1220 may include the first horizontal connection portion 1221 and the horizontal voltage line 1222. The first horizontal connection portion 1221 is a portion protruding in the second direction from the first division line 21, and may be integrally provided as a single body with the first division line 21. The first horizontal connection portion 1221 and the horizontal voltage line 1222 may be arranged at (e.g., in or on) different layers from each other, and may be electrically connected to each other via a first contact hole CNT1 passing through at least one insulating layer (e.g., the second organic insulating layer 212 shown in FIG. 9) located between the first horizontal connection portion 1221 and the horizontal voltage line 1222. As described above, the horizontal voltage line 1222 may extend in the second direction (e.g., the x-direction) to be adjacent to the fourth edge E4 of the display area DA, and may be electrically connected to the second horizontal connection portion 1223 protruding in an opposite direction (e.g., the −x direction) of the second direction from the second division line 22 (e.g., see FIG. 5).

The metal pattern 1150 covering the body portion 14 and the first division line 21 may be disposed on (e.g., over) the body portion 14 and the first division line 21. For example, when viewed from a direction perpendicular to or substantially perpendicular to the substrate 100 (e.g., in a plan view), the metal pattern 1150 may overlap with the body portion 14 and the first division line 21. An inner end 1150E of the metal pattern 1150 may be located closer to the third edge E3 of the display area DA than the first division line 21.

At least one organic insulating layer (e.g., the third organic insulating layer 213 shown in FIG. 9) covering a boundary (e.g., an edge) of the body portion 14 may be arranged between the metal pattern 1150 and the body portion 14. The metal pattern 1150 may expand (e.g., may extend) further outward than an end OE of the at least one organic insulating layer, and may be electrically connected to the body portion 14.

At least one organic insulating layer (e.g., the third organic insulating layer 213 shown in FIG. 8) may be located between the metal pattern 1150 and the first division line 21. The metal pattern 1150 and the first division line 21 may contact (e.g., may be in surface contact with) each other via an opening 213OP2 passing through (e.g., penetrating) the at least one organic insulating layer. Accordingly, the metal pattern 1150 may electrically connect the body portion 14 and the first division line 21 to each other, thereby preventing or reducing a change of a voltage or current applied or supplied to the common voltage division line 20 according to a distance from the first common voltage input unit 11 and the third common voltage input unit 13 (e.g., see FIG. 1).

In an embodiment, the metal pattern 1150 may include a plurality of pattern holes 1150H, as shown in FIG. 7. The pattern holes 1150H may be arranged at opposite sides of the valley portion V with the valley portion V therebetween. The pattern holes 1150H may act as a passage for outgassing of organic insulating layers located under (e.g., underneath) the metal pattern 1150.

The body portion 14 and the first division line 21 adjacent to the third edge E3 of the display area DA are mainly described with reference to FIG. 7. However, the body portion 14 and the third division line 23 adjacent to the second edge E2 (e.g., see FIG. 1) of the display area DA may have the same or substantially the same (or similar) structure as that described above with reference to FIG. 7, and/or the body portion 14 and the second division line 22 adjacent to the fourth edge E4 (e.g., see FIG. 1) of the display area DA may have the same or substantially the same (or similar) structure as that described above with reference to FIG. 7. For example, the valley portion V may be arranged between the body portion 14 and the second division line 22, and the metal pattern 1150 may cover the body portion 14 and the second division line 22. Similarly, the valley portion V may be arranged between the body portion 14 and the third division line 23, and the metal pattern 1150 may cover the body portion 14 and the third division line 23.

In other words, similar to the body portion 14, the valley portion V may be arranged to surround (e.g., around a periphery of) at least part of the display area DA, and the common voltage division line 20 (e.g., see FIG. 5) including the first division line 21, the second division line 22, and the third division line 23 may be integrally provided as a single body more inward than the valley portion V, so as to surround (e.g., around a periphery of) at least part of the display area DA. The second common voltage line 1220 may extend toward the display area DA from the second division line 22, and the first common voltage line 1230 may extend toward the display area DA from the third division line 23.

Referring to FIG. 8, inorganic insulating layers IIL may be disposed on (e.g., over) the substrate 100. Each of the inorganic insulating layers IIL may be integrally provided as a single body at (e.g., in or on) the display area DA and the peripheral area PA. The inorganic insulating layers IIL may include the buffer layer 201, the first gate insulating layer 203, the first interlayer insulating layer 205, the second interlayer insulating layer 207, the second gate insulating layer 209, and the third interlayer insulating layer 210, and some of these layers may be omitted as needed or desired, or an additional element may be included.

The first organic insulating layer 211, the second organic insulating layer 212, the third organic insulating layer 213, and the bank layer 215 may be disposed on (e.g., over) the inorganic insulating layers IIL. Each of the first organic insulating layer 211, the second organic insulating layer 212, the third organic insulating layer 213, and the bank layer 215 may extend to a portion of the peripheral area PA from the display area DA. In an embodiment, when an end located farthest from the second edge E2 of the display area DA from among ends of the first organic insulating layer 211, the second organic insulating layer 212, the third organic insulating layer 213, and the bank layer 215 is referred to as the end OE of the organic insulating layer, the end OE of the organic insulating layer may overlap with the body portion 14.

A first opening 211OP1 passing through (e.g., penetrating) the first organic insulating layer 211, a second opening 212OP1 passing through (e.g., penetrating) the second organic insulating layer 212, a third opening 213OP1 passing through (e.g., penetrating) the third organic insulating layer 213, and a fourth opening 215OP1 passing through (e.g., penetrating) the bank layer 215 may overlap with each other to constitute the valley portion V. The valley portion V may separate the first organic insulating layer 211, the second organic insulating layer 212, the third organic insulating layer 213, and the bank layer 215, so as to block or reduce a passage through which moisture permeates into the display area DA from the outside of the substrate 100 through an organic layer.

A first dam DAM1 may be arranged to overlap with an outer boundary (e.g., an outer edge) of the body portion 14. The first dam DAM1 may include a $1^{st}$-$1^{st}$ organic pattern 2110, a $1^{st}$-$2^{nd}$ organic pattern 2120, a $1^{st}$-$3^{rd}$ organic pattern 2130, and a $1^{st}$-$4^{th}$ organic pattern 2140. In an embodiment, one or more of the $1^{st}$-$1^{st}$ organic pattern 2110, the $1^{st}$-$2^{nd}$ organic pattern 2120, the $1^{st}$-$3^{rd}$ organic pattern 2130, and the $1^{st}$-$4^{th}$ organic pattern 2140 may be omitted as needed or desired. In an embodiment, the $1^{st}$-$1^{st}$ organic pattern 2110 may include the same material as that of the first organic insulating layer 211, the $1^{st}$-$2^{nd}$ organic pattern 2120 may include the same material as that of the second organic insulating layer 212, the $1^{st}$-$3^{rd}$ organic pattern 2130 may include the same material as that of the bank layer 215, and the $1^{st}$-$4^{th}$ organic pattern 2140 may include the same material as that of the spacer 217 (e.g., see FIG. 4).

A second dam DAM2 may be disposed to be spaced apart from the first dam DAM1 on (e.g., over) the body portion 14. The second dam DAM2 may include a $2^{nd}$-$1^{st}$ organic pattern 2220, a $2^{nd}$-$2^{nd}$ organic pattern 2230, and a $2^{nd}$-$3^{rd}$ organic pattern 2240. In an embodiment, one or more of the $2^{nd}$-$1^{st}$ organic pattern 2220, the $2^{nd}$-$2^{nd}$ organic pattern 2230, and the $2^{nd}$-$3^{rd}$ organic pattern 2240 may be omitted as needed or desired. In an embodiment, the $2^{nd}$-$1^{st}$ organic pattern 2220 may include the same material as that of the second organic insulating layer 212, the $2^{nd}$-$2^{nd}$ organic pattern 2230 may include the same material as that of the bank layer 215, and the $2^{nd}$-$3^{rd}$ organic pattern 2240 may include the same material as that of the spacer 217.

In an embodiment, a sub-dam may be disposed to be spaced apart from the second dam DAM2 on (e.g., over) the body portion 14. For example, FIGS. 8 and 9 show that a first sub-dam SDAM1 and a second sub-dam SDAM2 are disposed on (e.g., over) the body portion 14. The first sub-dam SDAM1 may include a $3^{rd}$-$1^{st}$ organic pattern 2330 and a $3^{rd}$-$2^{nd}$ organic pattern 2340, and the second sub-dam SDAM2 may include a $4^{th}$-$1^{st}$ organic pattern 2430 and a 4th-2nd organic pattern 2440. In an embodiment, at least one of the $3^{rd}$-$1^{st}$ organic pattern 2330 and the $3^{rd}$-$2^{nd}$ organic pattern 2340 may be omitted as needed or desired. Similarly, in an embodiment, at least one of the $4^{th}$-$1^{st}$ organic pattern 2430 and the $4^{th}$-$2^{nd}$ organic pattern 2440 may be omitted as needed or desired. In an embodiment, each of the $3^{rd}$-$1^{st}$ organic pattern 2330 and the $4^{th}$-$1^{st}$ organic pattern 2430 may include the same material as that of the bank layer 215, and each of the $3^{rd}$-$2^{nd}$ organic pattern 2340 and the $4^{th}$-$2^{nd}$ organic pattern 2440 may include the same material as that of the spacer 217.

The first dam DAM1, the second dam DAM2, the first sub-dam SDAM1, and the second sub-dam SDAM2 may be features for controlling the organic encapsulation layer 320 of the encapsulation layer 300. For example, because the organic encapsulation layer 320 does not reach an upper surface of the first dam DAM1, the first inorganic encapsulation layer 310 and the second inorganic encapsulation layer 330 may be in direct contact with each other on the upper surface of the first dam DAM1. Thus, a passage through which moisture permeates into the display area DA from the outside of the substrate 100 through the organic encapsulation layer 320 may be prevented or reduced.

The body portion 14 of the common voltage supply line 10 (e.g., see FIG. 5) may be disposed on (e.g., over) the inorganic insulating layers IIL. As described above, the body portion 14 may be arranged to be spaced apart from the second edge E2 of the display area DA with the valley portion V therebetween. The body portion 14 may include a first metal line 1110, a second metal line 1130, and a third metal line 1140. The first metal line 1110 may be disposed at (e.g., in or on) the same layer (e.g., on the third interlayer insulating layer 210) as that of the node connection line 166 (e.g., see FIG. 4), and the first metal line 1110 may include the same material as that of the node connection line 166.

The second metal line 1130 may be arranged to overlap with the first metal line 1110, and one boundary (e.g., one edge) 1130E of the second metal line 1130 may be disposed at (e.g., in or on) the same layer (e.g., on the first organic insulating layer 211) as that of the horizontal voltage line 1222. The second metal line 1130 may include the same material as that of the horizontal voltage line 1222.

The third metal line 1140 may be arranged to overlap with the first metal line 1110 and the second metal line 1130, and one boundary (e.g., one edge) 1140E of the third metal line 1140 may be disposed at (e.g., in or on) the same layer (e.g., on the second organic insulating layer 212) as that of the first common voltage line 1230 and the data line DL. The third metal line 1140 may include the same material as that of the first common voltage line 1230 and the data line DL.

One boundary (e.g., one edge) 1110E of the first metal line 1110 may be covered with the first organic insulating layer 211. Similarly, the one boundary 1130E of the second metal line 1130 may be covered with the second organic insulating layer 212, and the one boundary 1140E of the third metal line 1140 may be covered with the third organic insulating layer 213.

The valley portion V may be arranged to be closer to the display area DA than the one boundary 1110E of the first metal line 1110, the one boundary 1130E of the second metal line 1130, and the one boundary 1140E of the third metal line 1140. In other words, the first metal line 1110, the second metal line 1130, and the third metal line 1140 may be arranged to surround (e.g., around a periphery of) at least part of the display area DA from the outside of the valley portion V, and may not overlap with the valley portion V.

When viewed from the direction perpendicular to or substantially perpendicular to the upper surface of the substrate 100 (e.g., in a plan view), the third division line 23 may be arranged more inward than the valley portion V. For example, the third division line 23 may be arranged to be closer to the second edge E2 of the display area DA than the valley portion V. The third division line 23 may extend in the second direction (e.g., the x direction) along the second edge E2 of the display area DA.

The third division line 23 may be disposed on (e.g., over) the second organic insulating layer 212. In other words, the third division line 23 may be disposed at (e.g., in or on) the same layer as that of the first common voltage line 1230 and the data line DL, and may include the same material as that of the first common voltage line 1230 and the data line DL.

The third organic insulating layer 213, which is arranged to cover the third division line 23, may include the opening 213OP2 overlapping with the third division line 23. The opening 213OP2 of the third organic insulating layer 213 may expose an upper surface of the third division line 23, and the metal pattern 1150 and the third division line 23 may constitute a contact area CNT2 through the opening 213OP2. Through the contact area CNT2, the metal pattern 1150 and the third division line 23 may contact (e.g., may be in surface contact with) each other, and a voltage drop according to a position of the third division line 23 may be prevented or reduced.

The first common voltage line 1230 may extend toward the display area DA from the third division line 23. The first common voltage line 1230 may be disposed on (e.g., over) the second organic insulating layer 212, and in an embodiment, the first common voltage line 1230 may include the same material as that of the third division line 23. In another embodiment, the first common voltage line 1230 may be integrally provided as a single body with the third division line 23.

The metal pattern 1150 may be disposed on (e.g., over) the body portion 14 and the third organic insulating layer 213. For example, the metal pattern 1150 may be in contact with the third metal line 1140 of the body portion 14, and may be in contact with the upper surface of the third division line 23 through the opening 213OP2 of the third organic insulating layer 213. In other words, the metal pattern 1150 may electrically connect the common voltage supply line 10 (e.g., see FIG. 5) and the third division line 23 to each other, which are separated (e.g., spaced apart) from each other by the valley portion V.

As described above, the metal pattern 1150 may include a pattern hole 1150H. The pattern hole 1150H may be disposed on (e.g., over) the third organic insulating layer 213 with the valley portion V therebetween. Gas, which may be generated from the first organic insulating layer 211, the second organic insulating layer 212, the third organic insulating layer 213, and the bank layer 215 located under (e.g., underneath) the metal pattern 1150, may be emitted through the pattern hole 1150H passing through (e.g., penetrating) the metal pattern 1150.

The bank layer 215 may be disposed on (e.g., over) the metal pattern 1150. The bank layer 215 may constitute a partition portion 215W with the valley portion V therebetween. The partition portion 215W of the bank layer 215 may be disposed on (e.g., over) the pattern hole 1150H of the metal pattern 1150, and may expose a portion of an upper surface of the metal pattern 1150.

The opposite electrode 223 may be disposed on (e.g., over) the bank layer 215. The opposite electrode 223 may extend to the end OE of the organic insulating layer from the display area DA. The metal pattern 1150 and the opposite electrode 223 may be in contact with each other in an area between the partition portions 215W of the bank layer 215, and in the valley portion V. Thus, a common voltage may be applied to the opposite electrode 223 from the body portion 14 of the common voltage supply line 10 via the metal pattern 1150.

The encapsulation layer 300 may be disposed on (e.g., over) the opposite electrode 223. The encapsulation layer 300 may include at least one inorganic encapsulation layer and an organic encapsulation layer. For example, FIG. 8 shows that the encapsulation layer 300 includes the first inorganic encapsulation layer 310, the organic encapsulation layer 320, and the second inorganic encapsulation layer 330. The first inorganic encapsulation layer 310 and the second inorganic encapsulation layer 330 may cover an entire surface of the substrate 100. The organic encapsulation layer 320 between the first inorganic encapsulation layer 310 and the second inorganic encapsulation layer 330 may extend to the first dam DAM1 or the second dam DAM2 from the display area DA. As described above, the first dam DAM1, the second dam DAM2, the first sub-dam SDAM1, and the second sub-dam SDAM2 may control a flow of the organic encapsulation layer 320.

FIG. 9 is similar to FIG. 8, except that the first driving circuit 41 is located between the body portion 14 and the first division line 21 (e.g., in a plan view), and the first division line 21 is connected to the second common voltage line 1220. Hereinafter, redundant description between FIG. 8 and FIG. 9 may not be repeated, and the differences therebetween may be mainly described in more detail.

Referring to FIG. 9, the inorganic insulating layer IIL and the first driving circuit 41 may be disposed on (e.g., over) the substrate 100. The first driving circuit 41 may be arranged at (e.g., in or on) the peripheral area PA, and may extend in the first direction (e.g., the y direction) along the third edge E3 of the display area DA. In an embodiment, the first driving circuit 41 may include a scan driving circuit and signal lines, and the scan driving circuit and the signal lines may be arranged to be spaced apart from each other with the valley portion V therebetween. Because the first metal line 1110, the second metal line 1130, and the third metal line 1140 of the body 14 do not overlap with the first driving circuit 41, a probability of defects due to a short-circuit with the first driving circuit 41 may be reduced.

When viewed from the direction perpendicular to or substantially perpendicular to the upper surface of the substrate 100 (e.g., in a plan view), the first division line 21 may be arranged more inward than the valley portion V. For example, the first division line 21 may be arranged to be closer to the third edge E3 of the display area DA than the valley portion V. The first division line 21 may extend in the first direction (e.g., the y direction) along the third edge E3 of the display area DA.

The first division line 21 may be disposed on (e.g., over) the second organic insulating layer 212. In other words, the first division line 21 may be disposed at (e.g., in or on) the same layer as that of the first common voltage line 1230 and the data line DL, and may include the same material as that of the first common voltage line 1230 and the data line DL.

The second common voltage line 1220 may extend toward the display area DA from the first division line 21. The second common voltage line 1220 may include the first horizontal connection portion 1221, a second horizontal connection portion 1223 (e.g., see FIG. 5), and the horizontal voltage line 1222.

The first horizontal connection portion 1221 is a portion protruding in the second direction (e.g., the x direction) from the first division line 21, and in an embodiment, the first horizontal connection portion 1221 and the first division line 21 may be disposed at (e.g., in or on) the same layer as each other. The first horizontal connection portion 1221 and the first division line 21 may include the same material as each other, and may be integrally provided as a single body.

The first horizontal connection portion 1221 may be electrically connected to the horizontal voltage line 1222 via the first contact hole CNT1 passing through (e.g., penetrating) the second organic insulating layer 212. In an embodiment, the horizontal voltage line 1222 may be disposed at (e.g., in or on) the same layer as that of the second metal line 1130. In other words, the horizontal voltage line 1222 may be disposed on (e.g., over) the first organic insulating layer 211, and may include the same material as that of the second metal line 1130.

The third organic insulating layer 213, which is arranged to cover the first division line 21, may include the opening 213OP2 overlapping with the first division line 21. The opening 213OP2 of the third organic insulating layer 213 may expose an upper surface of the first division line 21, and the metal pattern 1150 and the first division line 21 may constitute the contact area CNT2 through the opening 213OP2. The metal pattern 1150 and the first division line 21 may contact (e.g., may be in surface contact with) each other through the contact area CNT2, and a voltage drop according to the position of the first division line 21 may be prevented or reduced.

Figure 10:
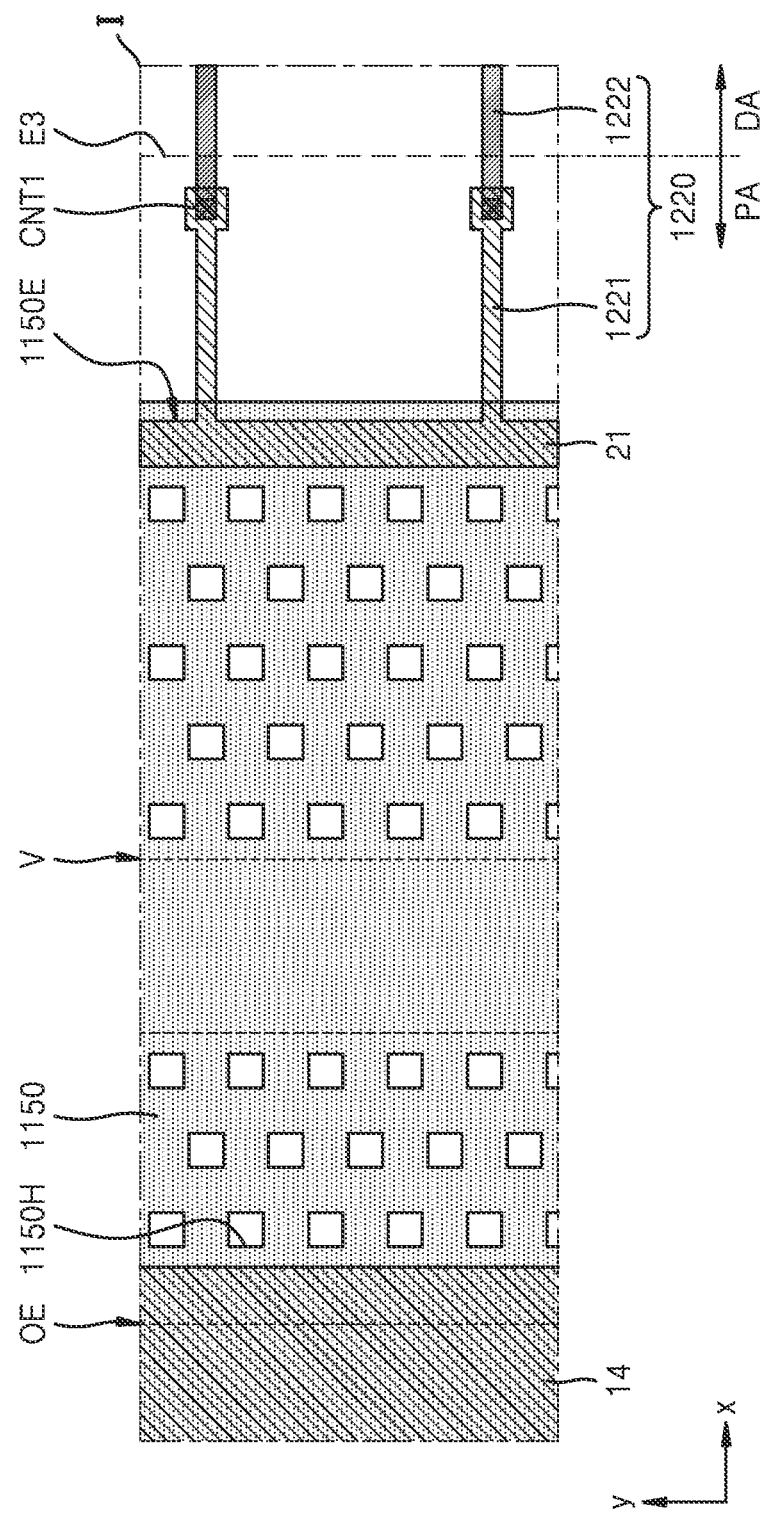
FIG. 10 is an enlarged plan view schematically illustrating a portion of a display apparatus according to an embodiment.
Figure 11:
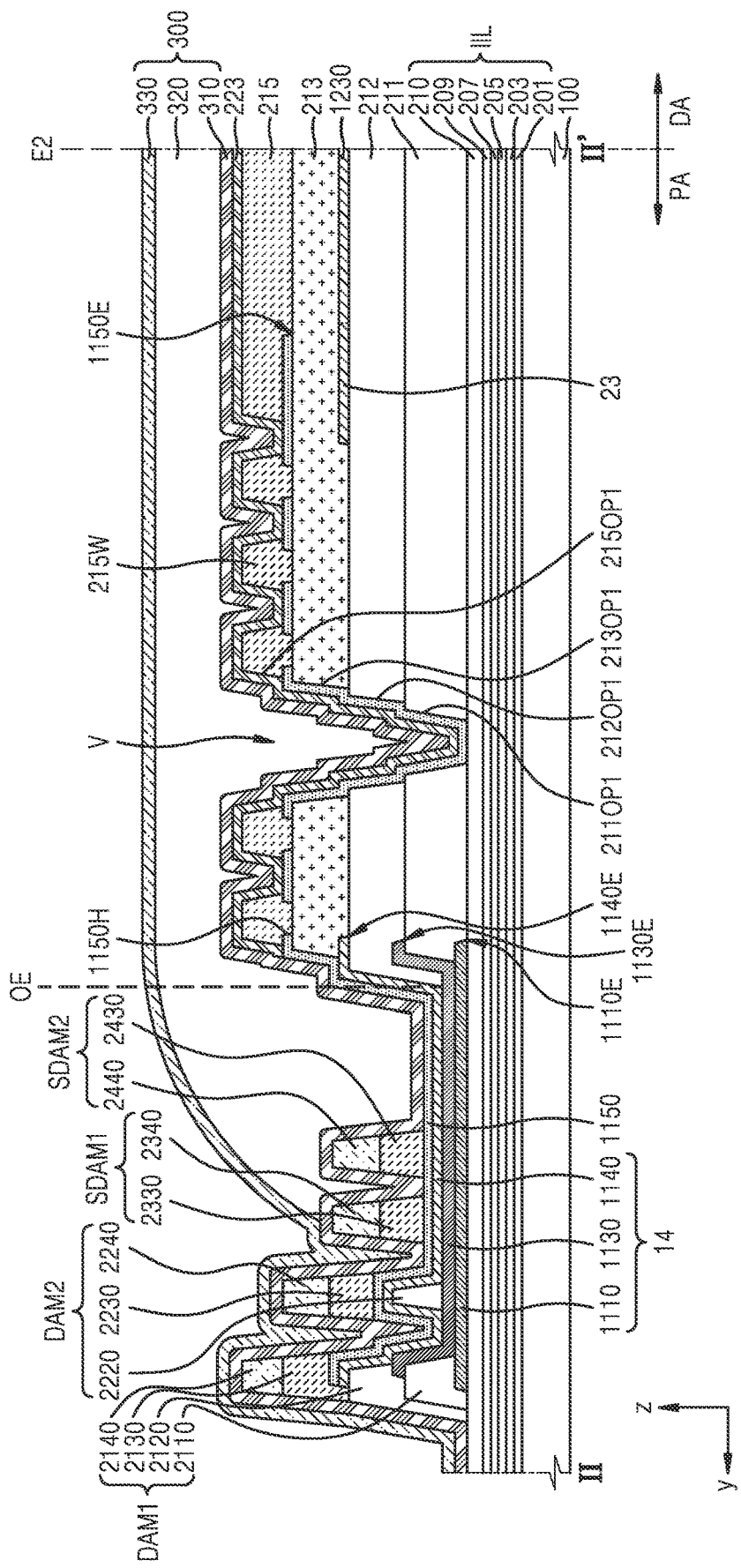
FIGS. 11-12 are cross-sectional views schematically illustrating a portion of a display apparatus.
Figure 12:
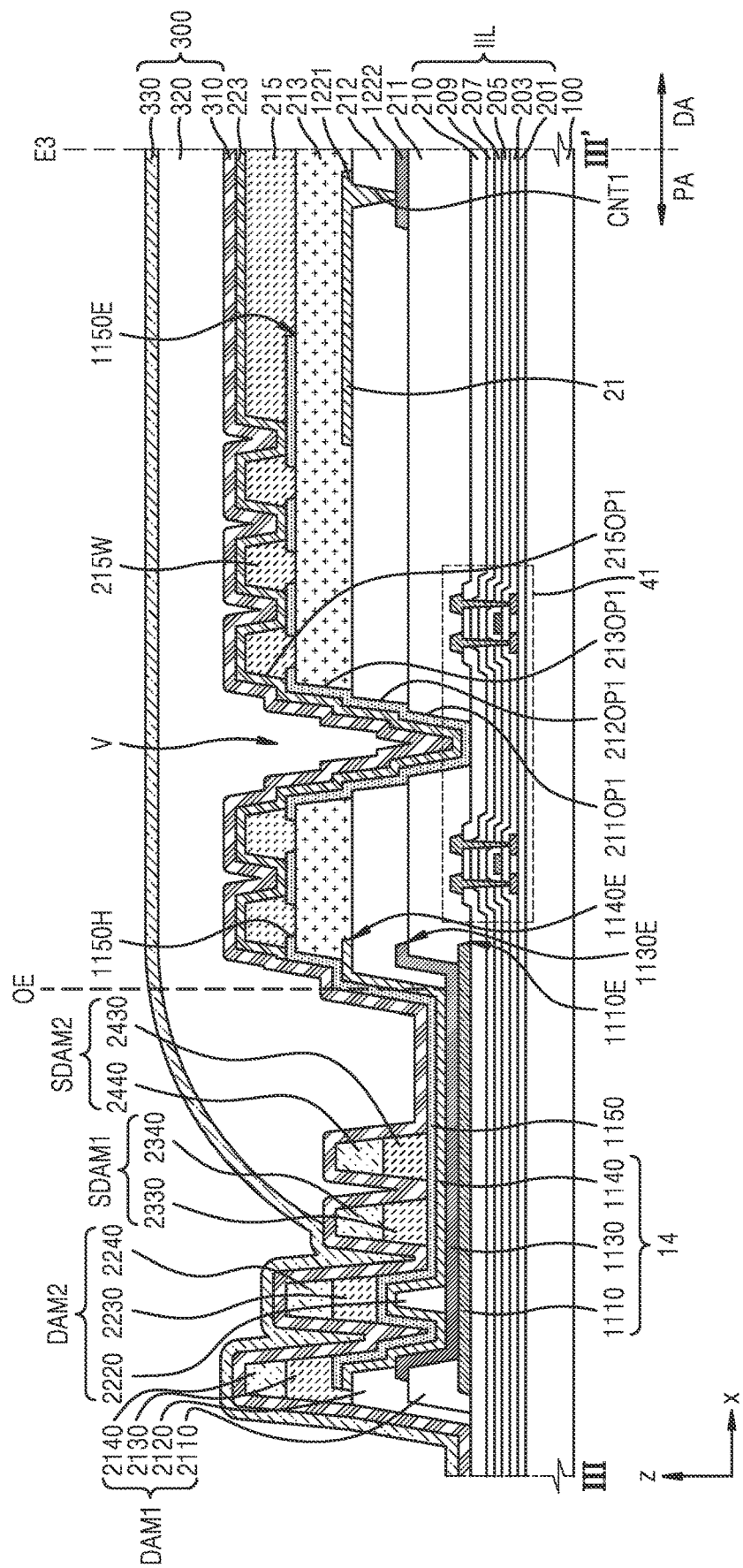

FIG. 10 is an enlarged plan view schematically illustrating a portion of a display apparatus according to an embodiment, and FIGS. 11-12 are cross-sectional views schematically illustrating a portion of a display apparatus. For example, FIG. 10 is an enlarged plan view of the region I in FIG. 5, according to another embodiment, FIG. 11 is a cross-sectional view taken along the line II-II' of FIG. 5, and FIG. 12 is a cross-sectional view taken along the line III-III' of FIG. 5.

The embodiments shown in FIGS. 10 to 12 are similar to those shown in FIGS. 7 to 9, respectively, differing in that the opening 213OP2 of the third organic insulating layer 213 that exposes the upper surfaces of the first division line 21 and the third division line 23 is not included.

Similar to FIG. 7, FIG. 10 is an enlarged view of a portion of the display apparatus from the body portion 14 of the common voltage supply line 10 (e.g., see FIG. 1) arranged at (e.g., in or on) the peripheral area PA along the third edge E3 of the display area DA to a portion of the display area DA. For convenience of illustration, the common voltage supply line 10, the common voltage division line 20 (e.g., see FIG. 1), and a portion of metal layers included in the second common voltage line 1220 are shown. For example, FIG. 10 shows the first division line 21, the second common voltage line 1220, the third metal line 1140 (e.g., see FIG. 12), and the metal pattern 1150. The third metal line 1140 is disposed at (e.g., in or on) the same layer as that of the first division line 21 from among the plurality of metal lines included in the body portion 14 of the common voltage supply line 10, and the metal pattern 1150 covers the body portion 14 and the first division line 21.

The first division line 21 of the common voltage division line 20 may be arranged in a space between the body portion 14 extending in the first direction (e.g., the y direction) and the third edge E3 of the display area DA. The valley portion V, which is provided by removing a portion of a plurality of organic layers, may be arranged between the body portion 14 and the first division line 21. The valley portion V may be arranged to surround (e.g., around a periphery of) at least part of the display area DA in a continuous manner, so as to block or reduce permeation of moisture into the display area DA from the outside of the substrate 100 through the organic layer.

The second common voltage line 1220 may extend in the second direction (e.g., the x direction) to the display area DA from the first division line 21. The second common voltage line 1220 may include the first horizontal connection portion 1221 and the horizontal voltage line 1222. The first horizontal connection portion 1221 is a portion protruding in the second direction from the first division line 21, and may be integrally provided as a single body with the first division line 21. The first horizontal connection portion 1221 and the horizontal voltage line 1222 may be disposed at (e.g., in or on) different layers from each other, and may be electrically connected to each other via a first contact hole CNT1 passing through (e.g., penetrating) at least one insulating layer (e.g., the second organic insulating layer 212 shown in FIG. 12) located between the first horizontal connection portion 1221 and the horizontal voltage line 1222. As described above, the horizontal voltage line 1222 may be adjacent to the fourth edge E4 of the display area DA, and may be electrically connected to the second horizontal connection portion 1223 protruding in the opposite direction (e.g., the (−) x direction) to the second direction from the second division line 22 (e.g., see FIG. 5).

The metal pattern 1150 covering the body portion 14 and the first division line 21 may be disposed over the body portion 14 and the first division line 21. For example, when viewed from the direction perpendicular to or substantially perpendicular to the substrate 100 (e.g., in a plan view), the metal pattern 1150 may overlap with the body portion 14 and the first division line 21. The inner end 1150E of the metal pattern 1150 may be located closer to the third edge E3 of the display area DA than the first division line 21.

At least one organic insulating layer (e.g., the third organic insulating layer 213 shown in FIG. 9) covering the boundary of the body portion 14 may be located between the metal pattern 1150 and the body portion 14. The metal pattern 1150 may expand (e.g., may extend) further outward than the end OE of the at least one organic insulating layer, and may be electrically connected to the body portion 14.

At least one organic insulating layer (e.g., the third organic insulating layer 213 shown in FIG. 8) may be located between the metal pattern 1150 and the first division line 21. As shown in FIG. 5, the first division line 21 may branch and extend from the first common voltage input unit 11, and may receive a common voltage, similar to the body portion 14 of the common voltage supply line 10 (e.g., see FIG. 5). When the body portion 14 of the common voltage supply line 10 is directly connected to the second common voltage line 1220, a short-circuit or interference with adjacent elements may occur due to the valley portion V. However, according to one or more embodiments of the present disclosure, the first division line 21 and the second common voltage line 1220 may be electrically connected to each other, so that a probability of the occurrence of defects may be reduced.

In an embodiment, the metal pattern 1150 may include a plurality of pattern holes 1150H. The pattern holes 1150H may be arranged at opposite sides of the valley portion V with the valley portion V therebetween. The pattern holes 1150H may act as a passage for outgassing of organic insulating layers located under (e.g., underneath) the metal pattern 1150.

Hereinafter, with reference to FIG. 10, the body portion 14 and the first division line 21 that is adjacent to the third edge E3 of the display area DA are mainly described. However, the body portion 14 and the third division line 23 that are adjacent to the second edge E2 (e.g., see FIG. 1) of the display area DA may have the same or substantially the same (or similar) structure as that described with reference to FIG. 10, and/or the body portion 14 and the second division line 22 that are adjacent to the fourth edge E4 (e.g., see FIG. 1) of the display area DA may have the same or substantially the same (or similar) structure as that described with reference to FIG. 10. For example, the valley portion V may be located between the body portion 14 and the second division line 22, and the metal pattern 1150 may cover the body portion 14 and the second division line 22. Similarly, the valley portion V may be located between the body portion 14 and the third division line 23, and the metal pattern 1150 may cover the body portion 14 and the third division line 23.

In other words, similar to the body portion 14, the valley portion V may be arranged to surround (e.g., around a periphery of) at least part of the display area DA, and the common voltage division line 20 (e.g., see FIG. 5) including the first division line 21, the second division line 22, and the third division line 23 may be integrally provided as a single body more inward than the valley portion V so as to surround (e.g., around a periphery of) at least part of the display area DA. The second common voltage line 1220 may extend to the second division line 22 from the first division line 21, and the first common voltage line 1230 may extend toward the display area DA from the third division line 23.

Referring to FIG. 11, inorganic insulating layers IIL may be disposed on (e.g., over) the substrate 100. Each of the inorganic insulating layers IIL may be integrally provided as a single body at (e.g., in or on) the display area DA and the peripheral area PA. The inorganic insulating layers IIL may include the buffer layer 201, the first gate insulating layer 203, the first interlayer insulating layer 205, the second interlayer insulating layer 207, the second gate insulating layer 209, and the third interlayer insulating layer 210, and some of these layers may be omitted as needed or desired or an additional element may be added thereto.

The first organic insulating layer 211, the second organic insulating layer 212, the third organic insulating layer 213, and the bank layer 215 may be disposed on (e.g., over) the inorganic insulating layers IIL. Each of the first organic insulating layer 211, the second organic insulating layer 212, the third organic insulating layer 213, and the bank layer 215 may extend to a portion of the peripheral area PA from the display area DA. In an embodiment, when an end located farthest from the second edge E2 of the display area DA from among the ends of the first organic insulating layer 211, the second organic insulating layer 212, the third organic insulating layer 213, and the bank layer 215 is referred to as the end OE of an organic insulating layer, the end OE of the organic insulating layer may overlap with the body portion 14.

The first opening 211OP1 passing through (e.g., penetrating) the first organic insulating layer 211, the second opening 212OP1 passing through (e.g., penetrating) the second organic insulating layer 212, the third opening 213OP1 passing through (e.g., penetrating) the third organic insulating layer 213, and the fourth opening 215OP1 passing through (e.g., penetrating) the bank layer 215 may overlap with each other to constitute the valley portion V. The valley portion V may separate the first organic insulating layer 211, the second organic insulating layer 212, the third organic insulating layer 213, and the bank layer 215, so as to block or reduce a passage through which moisture permeates into the display area DA from the outside of the substrate 100 through an organic layer.

The first dam DAM1 may be arranged to overlap with the outer boundary of the body portion 14. The second dam DAM2 and the sub-dams may be disposed to be spaced apart from each other on (e.g., over) the body portion 14. For example, FIGS. 11 and 12 show the first sub-dam SDAM1 and the second sub-dam SDAM2 that are disposed on (e.g., over) the body portion 14. The first dam DAM1, the second dam DAM2, the first sub-dam SDAM1, and the second sub-dam SDAM2 may be configured to control the organic encapsulation layer 320 of the encapsulation layer 300. For example, because the organic encapsulation layer 320 does not reach the upper surface of the first dam DAM1, the first inorganic encapsulation layer 310 and the second inorganic encapsulation layer 330 may be in direct contact with each other on the upper surface of the first dam DAM1. Thus, a passage through which moisture permeates into the display area DA from the outside of the substrate 100 through the organic encapsulation layer 320 may be prevented or reduced.

The body portion 14 of the common voltage supply line 10 (e.g., see FIG. 5) may be disposed on (e.g., over) the inorganic insulating layers IIL. As described above, the body portion 14 may be arranged to be spaced apart from the second edge E2 of the display area DA with the valley portion V therebetween. The body portion 14 may include a first metal line 1110, a second metal line 1130, and a third metal line 1140. The first metal line 1110 may be disposed at (e.g., in or on) the same layer (e.g., on the third interlayer insulating layer 210) as that of the node connection line 166 (e.g., see FIG. 4), and the first metal line 1110 may include the same material as that of the node connection line 166.

The second metal line 1130 may be arranged to overlap with the first metal line 1110, and one boundary 1130E of the second metal line 1130 may be disposed at (e.g., in or on) the same layer (e.g., on the first organic insulating layer 211) as that of the horizontal voltage line 1222. The second metal line 1130 may include the same material as that of the horizontal voltage line 1222.

The third metal line 1140 may be arranged to overlap with the first metal line 1110 and the second metal line 1130, and one boundary 1140E of the third metal line 1140 may be disposed at (e.g., in or on) the same layer (e.g., on the second organic insulating layer 212) as that of the first common voltage line 1230 and the data line DL. The third metal line 1140 may include the same material as that of the first common voltage line 1230 and the data line DL.

One boundary 1110E of the first metal line 1110 may be covered with the first organic insulating layer 211. Similarly, the one boundary 1130E of the second metal line 1130 may be covered with the second organic insulating layer 212, and the one boundary 1140E of the third metal line 1140 may be covered with the third organic insulating layer 213.

The valley portion V may be arranged to be closer to the display area DA than the one boundary 1110E of the first metal line 1110, the one boundary 1130E of the second metal line 1130, and the one boundary 1140E of the third metal line 1140. In other words, the first metal line 1110, the second metal line 1130, and the third metal line 1140 may be arranged to surround (e.g., around a periphery of) at least part of the display area DA from the outside of the valley portion V, and may not overlap with the valley portion V.

When viewed from the direction perpendicular to or substantially perpendicular to the upper surface of the substrate 100 (e.g., in a plan view), the third division line 23 may be arranged more inward than the valley portion V. For example, the third division line 23 may be arranged to be closer to the second edge E2 of the display area DA than the valley portion V. The third division line 23 may extend in the second direction (e.g., the x direction) along the second edge E2 of the display area DA.

The third organic insulating layer 213 may be disposed on (e.g., over) the third division line 23. The third organic insulating layer 213 may cover the third division line 23. Therefore, the third division line 23 may receive a common voltage from the first common voltage input unit 11 located under (e.g., underneath) the display panel 1 through the first division line 21 and the second division line 22.

The first common voltage line 1230 may extend toward the display area DA from the third division line 23. The first common voltage line 1230 may be disposed on (e.g., over) the second organic insulating layer 212, and in an embodiment, the first common voltage line 1230 may include the same material as that of the third division line 23. In another embodiment, the first common voltage line 1230 may be integrally provided as a single body with third division line 23.

The metal pattern 1150 may be disposed on (e.g., over) the body portion 14 and the third organic insulating layer 213, and the bank layer 215 may be disposed on (e.g., over) the metal pattern 1150. The bank layer 215 may constitute the partition portion 215W with the valley portion V therebetween. The partition portion 215W of the bank layer 215 may be disposed on (e.g., over) the pattern hole 1150H of the metal pattern 1150, and may expose a portion of the upper surface of the metal pattern 1150.

The opposite electrode 223 may be disposed on (e.g., over) the bank layer 215. The opposite electrode 223 may extend to the end OE of the organic insulating layer from the display area DA. The metal pattern 1150 and the opposite electrode 223 may be in contact with each other in an area between the partition portions 215W of the bank layer 215, and the valley portion V. Thus, a common voltage may be applied to the opposite electrode 223 from the body portion 14 of the common voltage supply line 10 via the metal pattern 1150.

The encapsulation layer 300 may be disposed on (e.g., over) the opposite electrode 223. The encapsulation layer 300 may include at least one inorganic encapsulation layer, and an organic encapsulation layer. For example, FIG. 8 shows the encapsulation layer 300 including the first inorganic encapsulation layer 310, the organic encapsulation layer 320, and the second inorganic encapsulation layer 330. The first inorganic encapsulation layer 310 and the second inorganic encapsulation layer 330 may cover the entire surface of the substrate 100. The organic encapsulation layer 320 between the first inorganic encapsulation layer 310 and the second inorganic encapsulation layer 330 may extend to the first dam DAM1 or the second dam DAM2 from the display area DA. As described above, the first dam DAM1, the second dam DAM2, the first sub-dam SDAM1, and the second sub-dam SDAM2 may control the flow of the organic encapsulation layer 320.

FIG. 12 is similar to FIG. 11, except that the first driving circuit 41 is located between the body portion 14 and the first division line 21, and the first division line 21 is connected to the second common voltage line 1220. Hereinafter, redundant description between FIGS. 11 and 12 may not be repeated, and the differences therebetween are mainly described.

Referring to FIG. 12, the inorganic insulating layer IIL and the first driving circuit 41 may be disposed on (e.g., over) the substrate 100. The first driving circuit 41 may be arranged at (e.g., in or on) the peripheral area PA, and may extend in the first direction (e.g., the y direction) along the third edge E3 of the display area DA. In an embodiment, the first driving circuit 41 may include a scan driving circuit and signal lines, and the scan driving circuit and the signal lines may be arranged to be spaced apart from each other with the valley portion V therebetween. Because the first metal line 1110, the second metal line 1130, and the third metal line 1140 of the body portion 14 do not overlap with the first driving circuit 41, a probability of defects due to a short-circuit with the first driving circuit 41 may be reduced.

When viewed from the direction perpendicular to or substantially perpendicular to the upper surface of the substrate 100 (e.g., in a plan view), the first division line 21 may be arranged more inward than the valley portion V. For example, the first division line 21 may be arranged closer to the third edge E3 of the display area DA than the valley portion V. The first division line 21 may extend in the first direction (e.g., the y direction) along the third edge E3 of the display area DA.

The first division line 21 may be disposed on (e.g., over) the second organic insulating layer 212. In other words, the first division line 21 may be disposed at (e.g., in or on) the same layer as that of the first common voltage line 1230 and the data line DL, and may include the same material as that of the first common voltage line 1230 and the data line DL.

The second common voltage line 1220 may extend toward the display area DA from the first division line 21. The second common voltage line 1220 may include the first horizontal connection portion 1221, the second horizontal connection portion 1223 (e.g., see FIG. 5), and the horizontal voltage line 1222.

The first horizontal connection portion 1221 is a portion protruding in the second direction (e.g., the x direction) from the first division line 21, and in an embodiment, the first horizontal connection portion 1221 and the first division line 21 may be disposed at (e.g., in or on) the same layer as each other. The first horizontal connection portion 1221 and the first division line 21 may include the same material as each other, and may be integrally provided as a single body.

The first horizontal connection portion 1221 may be electrically connected to the horizontal voltage line 1222 via the first contact hole CNT1 passing through (e.g., penetrating) the second organic insulating layer 212. In an embodiment, the horizontal voltage line 1222 may be disposed at (e.g., in or on) the same layer as that of the second metal line 1130. In other words, the horizontal voltage line 1222 may be disposed on (e.g., over) the first organic insulating layer 211, and may include the same material as that of the second metal line 1130.

According to one or more embodiments of the present disclosure described above, a display apparatus in which a high-quality image may be displayed while reducing an area of a dead space thereof may be implemented. However, the aspects and features of the present disclosure are not limited thereto.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display apparatus comprising:
    a substrate comprising a display area, and a peripheral area outside the display area;
    a common voltage supply line comprising a first common voltage input unit and a second common voltage input unit at the peripheral area and adjacent to a first edge of the display area, and a body portion connecting the first common voltage input unit and the second common voltage input unit to each other;
    a common voltage division line comprising a first division line branching from the first common voltage input unit, a second division line branching from the second common voltage input unit, and a third division line connecting the first division line and the second division line to each other;
    a first common voltage line connected to the third division line, and extending in a first direction to cross the display area; and
    a second common voltage line connected to the first division line or the second division line, and extending in a second direction crossing the first direction to cross the display area.

2. The display apparatus of claim 1, further comprising a first organic layer extending to the peripheral area from the display area, and covering the common voltage division line, wherein the first organic layer comprises a first opening between the body portion and the common voltage division line.

3. The display apparatus of claim 2, wherein the body portion is spaced from the first opening.

4. The display apparatus of claim 2, further comprising:
    a light-emitting diode at the display area, and comprising a pixel electrode, an emission layer, and an opposite electrode; and
    a metal pattern at the peripheral area, and electrically connecting the body portion and the opposite electrode to each other.

5. The display apparatus of claim 4, wherein the metal pattern is located on the first organic layer,
    wherein the first organic layer includes a second opening exposing an upper surface of the common voltage division line, and
    wherein the metal pattern and the common voltage division line are in direct contact with each other in the second opening.

6. The display apparatus of claim 4, wherein a boundary of the opposite electrode overlaps with a boundary of the first organic layer, or is located adjacent to the boundary of the first organic layer.

7. The display apparatus of claim 4, further comprising a second organic layer between the metal pattern and the opposite electrode,
    wherein the second organic layer includes a second opening overlapping with the first opening of the first organic layer, and
    wherein the opposite electrode is in contact with the metal pattern in the second opening.

8. The display apparatus of claim 4, wherein the pixel electrode and the metal pattern are located at a same layer as each other.

9. The display apparatus of claim 4, wherein the metal pattern includes a plurality of through-holes.

10. The display apparatus of claim 1, wherein the common voltage division line and the first common voltage line are located at a same layer as each other.

11. The display apparatus of claim 1, wherein the body portion comprises:
    a first metal line at the peripheral area;
    a second metal line on the first metal line; and
    a third metal line on the second metal line.

12. The display apparatus of claim 11, wherein the common voltage division line is located at a same layer as that of the third metal line.

13. The display apparatus of claim 11, wherein the second common voltage line comprises:
    a first horizontal connection portion protruding in the second direction from the first division line;
    a second horizontal connection portion protruding in an opposite direction to the second direction from the second division line; and
    a horizontal voltage line between the first horizontal connection portion and the second horizontal connection portion.

14. The display apparatus of claim 13, wherein the first horizontal connection portion and the second horizontal connection portion are located at a same layer as that of the common voltage division line, and
    the horizontal voltage line is located at a different layer from that of the common voltage division line.

15. The display apparatus of claim 1, further comprising a first driving circuit located between the body portion and the first division line.

16. The display apparatus of claim 1, further comprising a second driving circuit located between the body portion and the second division line.

17. The display apparatus of claim 1, wherein the common voltage supply line further comprises a third common voltage input unit between the first common voltage input unit and the second common voltage input unit, and wherein a portion of the first common voltage line extends to the third division line from the third common voltage input unit.

18. The display apparatus of claim 17, further comprising:
a first data line located at one side with respect to a virtual line passing through the third common voltage input unit;
a first data input line at the peripheral area; and
a first connection line at the display area and connecting the first data input line and the first data line to each other.

19. The display apparatus of claim 18, wherein the first connection line comprises:
a vertical connection line extending in the first direction; and
a horizontal connection line crossing the vertical connection line, and
wherein the first common voltage line and the vertical connection line are located at a same layer as each other.

20. The display apparatus of claim 19, wherein the second common voltage line comprises a horizontal voltage line extending in the second direction at the display area, and
wherein the horizontal connection line and the horizontal voltage line are located at a same layer as each other.

* * * * *